United States Patent
Obinata

(10) Patent No.: US 7,330,928 B2
(45) Date of Patent: Feb. 12, 2008

(54) SEMICONDUCTOR DEVICE AND ELECTRONIC INSTRUMENT

(75) Inventor: Atsushi Obinata, Hachioji (JP)

(73) Assignee: Seiko Epson Corporation (JP)

( * ) Notice: Subject to any disclaimer, the term of this patent is extended or adjusted under 35 U.S.C. 154(b) by 239 days.

(21) Appl. No.: 11/291,386

(22) Filed: Dec. 1, 2005

(65) Prior Publication Data

US 2006/0123188 A1 Jun. 8, 2006

(30) Foreign Application Priority Data

Dec. 3, 2004 (JP) ............................. 2004-351692

(51) Int. Cl.
G06F 12/00 (2006.01)
(52) U.S. Cl. ................................... 711/106
(58) Field of Classification Search ................. 711/106
See application file for complete search history.

(56) References Cited

U.S. PATENT DOCUMENTS

2002/0120811 A1* 8/2002 Maeda ....................... 711/105
2002/0184438 A1* 12/2002 Usui .......................... 711/106
2004/0034732 A1* 2/2004 Valin et al. ..................... 711/4

FOREIGN PATENT DOCUMENTS

JP 06-060645 3/1994

* cited by examiner

Primary Examiner—Reginald Bragdon
Assistant Examiner—Aracelis Ruiz
(74) Attorney, Agent, or Firm—Harness, Dickey & Pierce, P.L.C.

(57) ABSTRACT

A semiconductor device including: a DRAM which is a volatile memory; a PLL circuit which outputs an operation clock signal generated by multiplying an input clock signal; a circuit block which operates in synchronization with the operation clock signal; first and second refresh controllers for requesting a refresh operation of the DRAM; and a memory controller which arbitrates between an access request for the DRAM from the circuit block and a refresh request from the first refresh controller. In a first mode in which the PLL circuit operates, the first refresh controller issues the refresh request to the DRAM controller. In a second mode in which the operation of the PLL circuit stops, the second refresh controller issues the refresh request, the refresh request bypassing the DRAM controller.

14 Claims, 23 Drawing Sheets

SEMICONDUCTOR DEVICE AND ELECTRONIC INSTRUMENT

Japanese Patent Application No. 2004-351692, filed on Dec. 3, 2004, is hereby incorporated by reference in its entirety.

BACKGROUND OF THE INVENTION

The present invention relates to a semiconductor device and an electronic instrument including the same.

A low power consumption operation has been strongly demanded for a semiconductor device provided in a portable telephone (electronic instrument in a broad sense) which operates by using a battery. On the other hand, it is necessary for a portable telephone to perform advanced information processing such as image processing and communication processing. Therefore, the capacity of a memory has been increased in order to retain an increased amount of processing data. A dynamic random access memory (DRAM) is included in a semiconductor device provided in such a portable instrument, for example. In this case, power consumption may be reduced by causing the semiconductor device to appropriately transition to a standby mode.

In order to operate a semiconductor device, it is generally necessary to supply a clock signal to the semiconductor device. A clock signal having a desired frequency may be directly applied to a semiconductor device from the outside. As another method, a phased locked loop (PLL) circuit may be provided in a semiconductor device, and a clock signal having a desired frequency may be generated by multiplying a low-frequency clock signal supplied from the outside. In general, the method of providing the PLL circuit in the semiconductor device is used from the viewpoint of convenience of use.

When causing the DRAM to retain data, a refresh operation is required in order to prevent the retained data from being lost. However, when generating a clock signal by using the PLL circuit, even if the semiconductor device transitions to the standby mode aiming at reducing power consumption, the amount of power consumed by the PLL circuit and a refresh controller for performing the refresh operation of the DRAM cannot be ignored.

JP-A-6-60645 discloses a technology for reducing power consumption accompanying the refresh operation of the DRAM, for example. This technology utilizes the fact that current consumption during the refresh operation in a self-refresh mode is smaller than current consumption during the refresh operation in a RAS-only refresh mode or a CAS-before-RAS refresh mode. In this technology, use or non-use of the memory is detected, and the refresh operation is performed in the RAS-only refresh mode or the CAS-before-RAS refresh mode when the memory is used and is performed in the self-refresh mode when the memory is not used, thereby reducing power consumption without causing the retained data to be lost.

However, this technology cannot be used for a DRAM which does not have the function of the self-refresh mode. Therefore, in a semiconductor device including a DRAM which does not have the self-refresh mode, a clock signal is generated by using the PLL circuit, and the refresh operation of the DRAM is performed based on the clock signal as described above. This makes it necessary to always operate the PLL circuit so that the PLL circuit and the refresh controller are operated even when it is desired to merely retain data without accessing the DRAM, whereby unnecessary current consumption occurs.

SUMMARY

According to a first aspect of the invention, there is provided a semiconductor device, comprising:

a volatile memory which retains data by a cyclic refresh operation;

a first PLL circuit which multiplies an input clock signal and outputs an operation clock signal having a frequency higher than a frequency of the input clock signal;

a circuit block which operates in synchronization with the operation clock signal;

first and second refresh controllers for requesting the refresh operation of the volatile memory; and a memory controller which arbitrates between an access request for the volatile memory from the circuit block and a refresh request from the first refresh controller, and controls access to the volatile memory in response to one of the access request and the refresh request, wherein, in a first mode in which the first PLL circuit operates, the first refresh controller operates in synchronization with the operation clock signal and issues the refresh request for the volatile memory to the memory controller; and wherein, in a second mode in which the first PLL circuit stops operation, supply of the operation clock signal to the first refresh controller and the memory controller is stopped, and the second refresh controller operates in synchronization with the input clock signal and issues the refresh request to the volatile memory, the refresh request bypassing the memory controller.

According to a second aspect of the invention, there is provided a semiconductor device, comprising:

a volatile memory which retains data by a cyclic refresh operation;

a first PLL circuit which multiplies an input clock signal and outputs an operation clock signal having a frequency higher than a frequency of the input clock signal;

a circuit block which operates in synchronization with the operation clock signal;

a refresh controller for requesting the refresh operation of the volatile memory; and a memory controller which arbitrates between an access request for the volatile memory from the circuit block and a refresh request from the refresh controller, and controls access to the volatile memory in response to one of the access request and the refresh request, wherein, in a first mode in which the first PLL circuit operates, the refresh controller operates in synchronization with the operation clock signal and issues the refresh request for the volatile memory; and wherein, in a second mode in which the first PLL circuit stops operation, the refresh controller operates in synchronization with the input clock signal and issues the refresh request for the volatile memory.

According to a third aspect of the invention, there is provided an electronic instrument, comprising:

any one of the above-described semiconductor devices.

According to a fourth aspect of the invention, there is provided an electronic instrument, comprising:

a display panel;

a display driver which drives the display panel based on image data; and any one of the above-described semiconductor devices which supplies data retained in the volatile memory to the display driver as the image data.

DETAILED DESCRIPTION OF THE EMBODIMENTS

Figure 1:
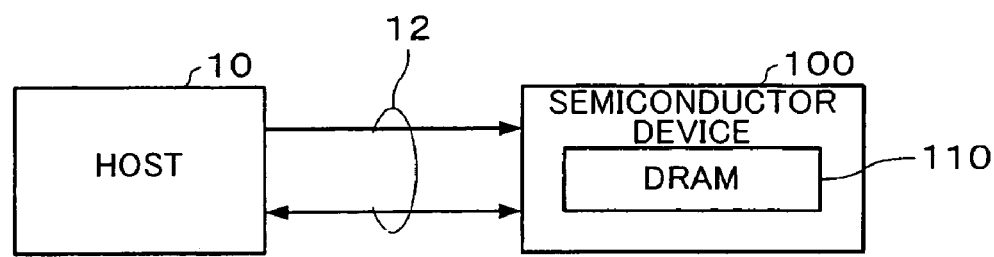
FIG. 1 shows the relationship between a semiconductor device and a host.

The invention may provide a semiconductor device which can reduce power consumption without causing data stored in a memory which requires a refresh operation to be lost, even when the semiconductor device includes a PLL circuit, and an electronic instrument including the semiconductor device.

According to one embodiment of the invention, there is provided a semiconductor device, comprising:

a volatile memory which retains data by a cyclic refresh operation;

a first PLL circuit which multiplies an input clock signal and outputs an operation clock signal having a frequency higher than a frequency of the input clock signal;

a circuit block which operates in synchronization with the operation clock signal;

first and second refresh controllers for requesting the refresh operation of the volatile memory; and a memory controller which arbitrates between an access request for the volatile memory from the circuit block and a refresh request from the first refresh controller, and controls access to the volatile memory in response to one of the access request and the refresh request, wherein, in a first mode in which the first PLL circuit operates, the first refresh controller operates in synchronization with the operation clock signal and issues the refresh request for the volatile memory to the memory controller; and wherein, in a second mode in which the first PLL circuit stops operation, supply of the operation clock signal to the first refresh controller and the memory controller is stopped, and the second refresh controller operates in synchronization with the input clock signal and issues the refresh request to the volatile memory, the refresh request bypassing the memory controller.

In this embodiment, the second refresh controller is provided separately from the first refresh controller. While the first refresh controller issues the refresh request for the volatile memory in the first mode in which the first PLL circuit operates, the second refresh controller issues the refresh request in the second mode in which the operation of the first PLL circuit stops. In the second mode, the supply of the operation clock signal to the first refresh controller and the memory controller is stopped. Therefore, the second refresh controller operates in synchronization with the input clock signal and directly issues the refresh request to the volatile memory without accessing the memory controller. Specifically, since the supply of the high-frequency operation clock signal is suspended and only the circuit which operates in synchronization with the low-frequency input clock signal operates, power consumption can be reduced.

Moreover, only the minimum circuits can be operated in the second mode by providing the second refresh controller for the second mode separately from the first refresh controller.

If the refresh period of the volatile memory is constant, the first refresh controller which operates in synchronization with the high-frequency operation clock signal requires additional circuits for counting the refresh period (additional flip-flops which retain the count value) in comparison with the second refresh controller which operates in synchronization with the low-frequency input clock signal. Therefore, the additional circuits also operate when the first refresh controller operates in synchronization with the input clock signal, so that unnecessary power consumption occurs. Or, additional control becomes necessary. The control and the configuration can be simplified by separately providing the second refresh controller as in one embodiment of the invention, whereby power consumption can be further reduced.

This semiconductor device may further comprise:

a second PLL circuit which has a multiplication factor lower than a multiplication factor of the first PLL circuit, multiplies the input clock signal, and outputs a refresh clock signal having a frequency higher than the frequency of the input clock signal and lower than the frequency of the operation clock signal, wherein, in the second mode, the second refresh controller operates in synchronization with the refresh clock signal and issues the refresh request to the volatile memory, the refresh request bypassing the memory controller.

In this embodiment, the second PLL circuit is provided for the second refresh controller separately from the first PLL circuit. The multiplication factor of the second PLL circuit is lower than the multiplication factor of the first PLL circuit. Therefore, when the identical input clock signal is supplied to the first and second PLL circuits, the frequency of the clock signal output from the second PLL circuit is lower than the frequency of the clock signal output from the first PLL circuit. Therefore, power consumption of the second PLL circuit can be reduced in comparison with the first PLL circuit.

For example, when the frequency of the input clock signal is low, the second refresh controller may not issue the refresh request in synchronization with the input clock signal within the refresh period of the volatile memory. According to one embodiment of the invention, the refresh operation in the second mode can be realized without increasing power consumption to a large extent.

This semiconductor device may further comprise:

a register for setting control information which indicates a refresh target block when a storage region of the volatile memory is divided into a plurality of blocks, wherein the refresh operation is performed for only the refresh target block of the volatile memory indicated by the control information in response to the refresh request from the second refresh controller.

In this embodiment, since the refresh operation can be omitted in memory block units, power consumption can be further reduced in the first and second modes.

This semiconductor device may further comprise:

a first PLL circuit operation control register which causes the first PLL circuit to start to operate, and is accessed asynchronously to the operation clock signal and the input clock signal, wherein the first PLL circuit starts on condition that the first PLL circuit operation control register has been accessed in the second mode.

According to one embodiment of the invention, there is provided a semiconductor device, comprising:

a volatile memory which retains data by a cyclic refresh operation;

a first PLL circuit which multiplies an input clock signal and outputs an operation clock signal having a frequency higher than a frequency of the input clock signal;

a circuit block which operates in synchronization with the operation clock signal;

a refresh controller for requesting the refresh operation of the volatile memory; and a memory controller which arbitrates between an access request for the volatile memory from the circuit block and a refresh request from the refresh controller, and controls access to the volatile memory in response to one of the access request and the refresh request, wherein, in a first mode in which the first PLL circuit operates, the refresh controller operates in synchronization with the operation clock signal and issues the refresh request for the volatile memory; and wherein, in a second mode in which the first PLL circuit stops operation, the refresh controller operates in synchronization with the input clock signal and issues the refresh request for the volatile memory.

In this embodiment, the refresh operation of the volatile memory can be realized even when stopping the operation of the first PLL circuit. Therefore, the PLL circuit can be prevented from consuming a large amount of power in the second mode, whereby power consumption can be reduced.

This semiconductor device may further comprise:

a second PLL circuit which has a multiplication factor lower than a multiplication factor of the first PLL circuit, multiplies the input clock signal, and outputs a refresh clock signal having a frequency higher than the frequency of the input clock signal and lower than the frequency of the operation clock signal, wherein, in the second mode, the refresh controller operates in synchronization with the refresh clock signal and issues the refresh request to the volatile memory, the refresh request bypassing the memory controller.

In this embodiment, the second PLL circuit is provided for the second refresh controller separately from the first PLL circuit. The multiplication factor of the second PLL circuit is lower than the multiplication factor of the first PLL circuit. Therefore, when the identical input clock signal is supplied to the first and second PLL circuits, the frequency of the clock signal output from the second PLL circuit is lower than the frequency of the clock signal output from the first PLL circuit. Therefore, power consumption of the second PLL circuit can be reduced in comparison with the first PLL circuit.

For example, when the frequency of the input clock signal is low, the refresh controller may not issue the refresh request in synchronization with the input clock signal within the refresh period of the volatile memory. According to one embodiment of the invention, the refresh operation in the second mode can be realized without increasing power consumption to a large extent.

This semiconductor device may further comprise:

a register for setting control information which indicates a refresh target block when a storage region of the volatile memory is divided into a plurality of blocks, wherein the refresh operation is performed for only the refresh target block of the volatile memory indicated by the control information in response to the refresh request from the memory controller.

In this embodiment, since the refresh operation can be omitted in memory block units, power consumption can be further reduced in the first and second modes.

This semiconductor device may further comprise:

a first PLL circuit operation control register which causes the first PLL circuit to start to operate, and is accessed asynchronously to the operation clock signal and the input clock signal, wherein the first PLL circuit starts on condition that the first PLL circuit operation control register has been accessed in the second mode.

In any of the above-described semiconductor devices, the volatile memory may retain image data supplied to a display driver which drives a display panel.

According to one embodiment of the invention, there is provided an electronic instrument, comprising any one of the above-described semiconductor devices.

According to one embodiment of the invention, there is provided an electronic instrument, comprising:

a display panel;

a display driver which drives the display panel based on image data; and any of the above-described semiconductor devices which supplies data retained in the volatile memory to the display driver as the image data.

An electronic instrument including a semiconductor device which can reduce power consumption without causing data stored in a memory which requires a refresh operation to be lost, even when the semiconductor device includes a PLL circuit, can be thus provided.

These embodiments of the invention will be described in detail below, with reference to the drawings. Note that the embodiments described below do not in any way limit the scope of the invention laid out in the claims herein. In addition, not all of the elements of the embodiments described below should be taken as essential requirements of the invention.

1. Semiconductor Device

FIG. 1 shows the relationship between a semiconductor device described below and a host.

A semiconductor device 100 described below includes a DRAM 110 as a volatile memory which retains data by a cyclic (periodic) refresh operation. The semiconductor device 100 is connected with a host 10 including a central processing unit (CPU) through a bus 12. The host 10 outputs an access control signal to the semiconductor device 100 through the bus 12 and writes data into the DRAM 110. The host 10 outputs the access control signal to the semiconductor device 100 through the bus 12 and reads data from the DRAM 110. The semiconductor device 100 cyclically performs a refresh operation in order to prevent data retained in the DRAM 110 from being lost.

A low-frequency (e.g. 32 kHz) system clock signal is supplied to the host 10 and the semiconductor device 100 as an input clock signal $CLK_L$. The host 10 and the semiconductor device 100 operate in synchronization with a high-frequency (e.g. 60 MHz) operation clock signal $CLK_H$ generated by multiplying (a frequency of) the input clock signal $CLK_L$.

In FIG. 1, the host 10 is connected with the semiconductor device 100 through the bus 12. However, the semiconductor device 100 may include the host 10.

1.1 First Embodiment

Figure 2:
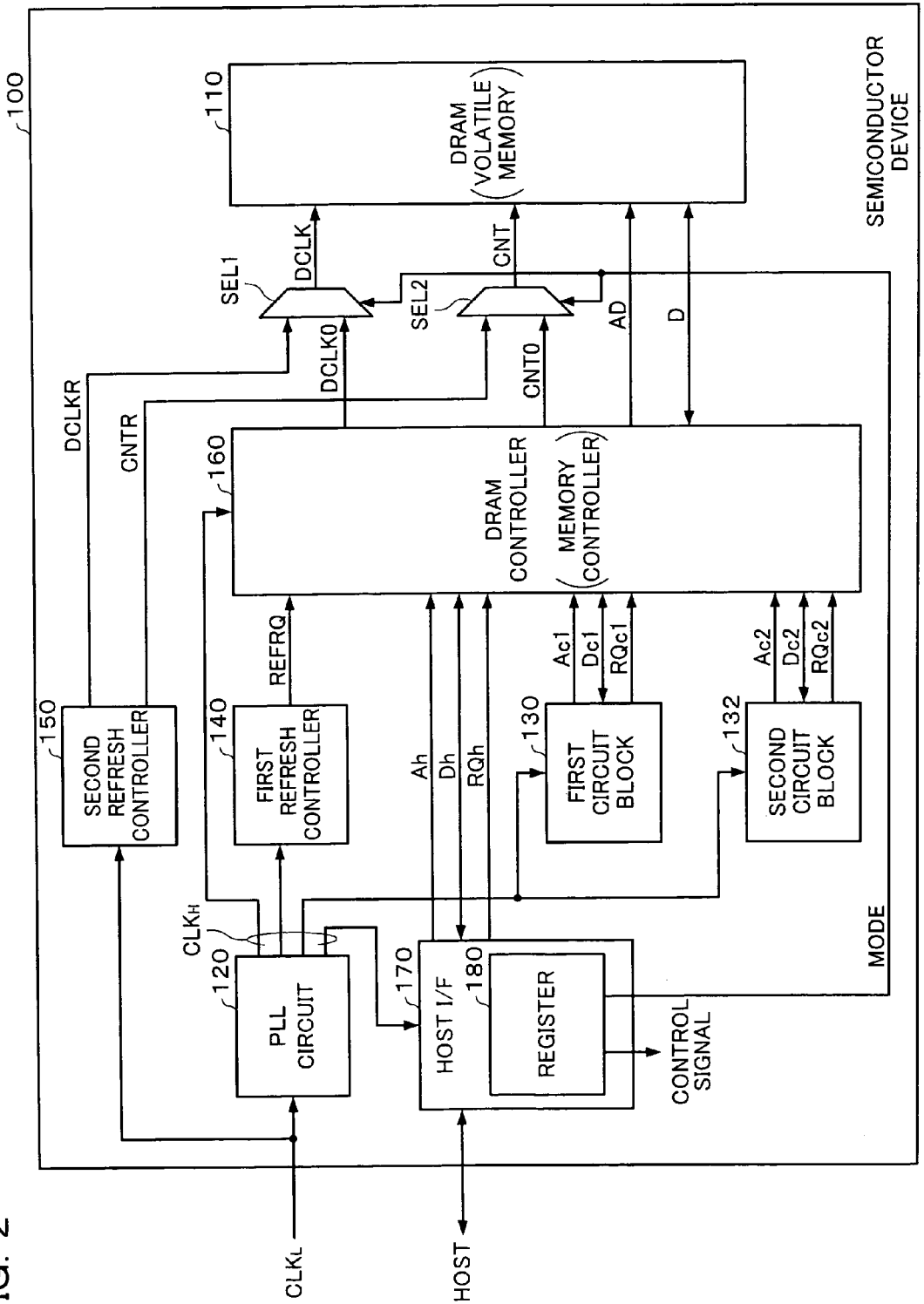
FIG. 2 is a block diagram showing a configuration example of a semiconductor device according to a first embodiment.

FIG. 2 is a block diagram showing a configuration example of the semiconductor device according to a first embodiment.

The semiconductor device 100 includes the DRAM 110 as a volatile memory, and a PLL circuit (first PLL circuit) 120. The PLL circuit 120 multiplies the input clock signal $CLK_L$ and outputs the operation clock signal $CLK_H$ having a frequency higher than the frequency of the input clock signal $CLK_L$. The semiconductor device 100 includes a circuit block (logic circuit block or combinational circuit block) which operates in synchronization with the operation clock signal $CLK_H$. In FIG. 2, the semiconductor device 100 includes first and second circuit blocks 130 and 132, each of which operates in synchronization with the operation clock signal $CLK_H$.

The semiconductor device 100 includes first and second refresh controllers 140 and 150, and a DRAM controller 160 as a memory controller. The first and second refresh controllers 140 and 150 are used to perform the refresh operation of the DRAM 110. One of the first and second refresh controllers 140 and 150 requests the refresh operation of the DRAM 110.

The DRAM controller 160 arbitrates among the access requests for the DRAM 110 from the first and second circuit blocks 130 and 132 (circuit blocks) and the refresh request from the first refresh controller 140. The DRAM controller 160 performs access control (read control, write control, or refresh control) of the DRAM 110 corresponding to one of the access requests and the refresh request subjected to arbitration. The DRAM controller 160 does not arbitrate the refresh request from the second refresh controller 150.

The first refresh controller 140 operates in synchronization with the operation clock signal $CLK_H$, and detects whether or not a predetermined period (refresh period of the DRAM 110) has elapsed. When the first refresh controller 140 detects that the predetermined period has elapsed, the first refresh controller 140 outputs a refresh request REFRQ to the DRAM controller 160.

The second refresh controller 150 operates in synchronization with the input clock signal $CLK_L$, and detects whether or not the above-mentioned period (refresh period of the DRAM 110) has elapsed. When the second refresh controller 150 detects that the predetermined period has elapsed, the second refresh controller 150 outputs a DRAM clock signal DCLKR and an access control signal CNTR (e.g. CS signal, RAS signal, CAS signal, or WE signal) for performing the refresh operation of the DRAM 160.

The DRAM controller 160 arbitrates among access requests RQc1 and RQc2 from the first and second circuit blocks 130 and 132 and the refresh request REFRQ from the first refresh controller 140. The DRAM controller 160 outputs a DRAM clock signal DCLK0, an access control signal CNT0 (CS signal, RAS signal, CAS signal, or WE signal), and an access address AD to the DRAM 110 corresponding to one of the access requests RQc1 and RQc2 and the refresh request REFRQ subjected to arbitration.

When the DRAM controller 160 controls writing into the DRAM 110, the DRAM controller 160 outputs an access address Ac1 and data Dc1 from the first circuit block 130 or an access address Ac2 and data Dc2 from the second circuit block as the access address AD and data D of the DRAM 110.

When the DRAM controller 160 controls reading from the DRAM 110, the DRAM controller 160 outputs the access address Ac1 from the first circuit block 130 or the access address Ac2 from the second circuit block as the access address AD of the DRAM 110. The DRAM controller 160 outputs the data D read from the DRAM 110 as the data Dc1 for the first circuit block 130 or the data Dc2 for the second circuit block 132.

The semiconductor device 100 includes a host interface (I/F) circuit 170. Data from the host 10 is input to the host I/F circuit 170. The host I/F circuit 170 performs interface processing (processing of receiving data from the host or signal buffering), and supplies the data after the interface processing to the DRAM controller 160. The data read from the DRAM 110 by the DRAM controller 160 is supplied to the host 10 through the host I/F circuit 170. In this case, the host I/F circuit 170 performs interface processing (processing of transmitting data to the host or signal buffering), and supplies the data after the interface processing to the host 10.

The host I/F circuit 170 includes a register 180 accessed by the host 10, and outputs control information corresponding to the value set in the register 180. Each section of the semiconductor device 100 is controlled based on the control information.

The semiconductor device 100 according to the first embodiment has a normal mode (first mode) in which the PLL circuit 120 (first PLL circuit) operates and a standby mode (second mode) in which the PLL circuit 120 does not operate (does not output the operation clock signal $CLK_H$). The semiconductor device 100 selectively operates in the normal mode or the standby mode. In more detail, the operation mode is designated by a control signal MODE generated corresponding to the value set in the register 180.

In the semiconductor device 100 in the normal mode, the first refresh controller 140 operates in synchronization with the operation clock signal $CLK_H$, and issues the refresh request for the DRAM 110. In FIG. 2, as result of arbitration by the DRAM controller 160, the refresh operation of the DRAM 110 is performed in response to the refresh request.

In the semiconductor device 100 in the standby mode, the supply of the operation clock signal $CLK_H$ to the first refresh controller 140 and the DRAM controller 160 is suspended. The second refresh controller 150 operates in synchronization with the input clock signal $CLK_L$, and issues the refresh request to the DRAM 110, the refresh request bypassing the DRAM controller 160.

Therefore, the semiconductor device 100 may include selectors SEL1 and SEL2.

When the normal mode is designated by the control signal MODE, the selector SEL1 outputs the DRAM clock signal DCLK0 from the DRAM controller 160 to the DRAM 110 as the DRAM clock signal DCLK. When the standby mode is designated by the control signal MODE, the selector SEL1 outputs the DRAM clock signal DCLKR from the second refresh controller 150 to the DRAM 110 as the DRAM clock signal DCLK.

When the normal mode is designated by the control signal MODE, the selector SEL2 outputs the access control signal CNT0 from the DRAM controller 160 to the DRAM 110 as the access control signal CNT. When the standby mode is designated by the control signal MODE, the selector SEL2 outputs the access control signal CNTR from the second refresh controller 150 to the DRAM 110 as the DRAM clock signal DCLK.

The effects of the semiconductor device 100 according to the first embodiment are described below by comparing the semiconductor device 100 with a comparative example.

Figure 3:
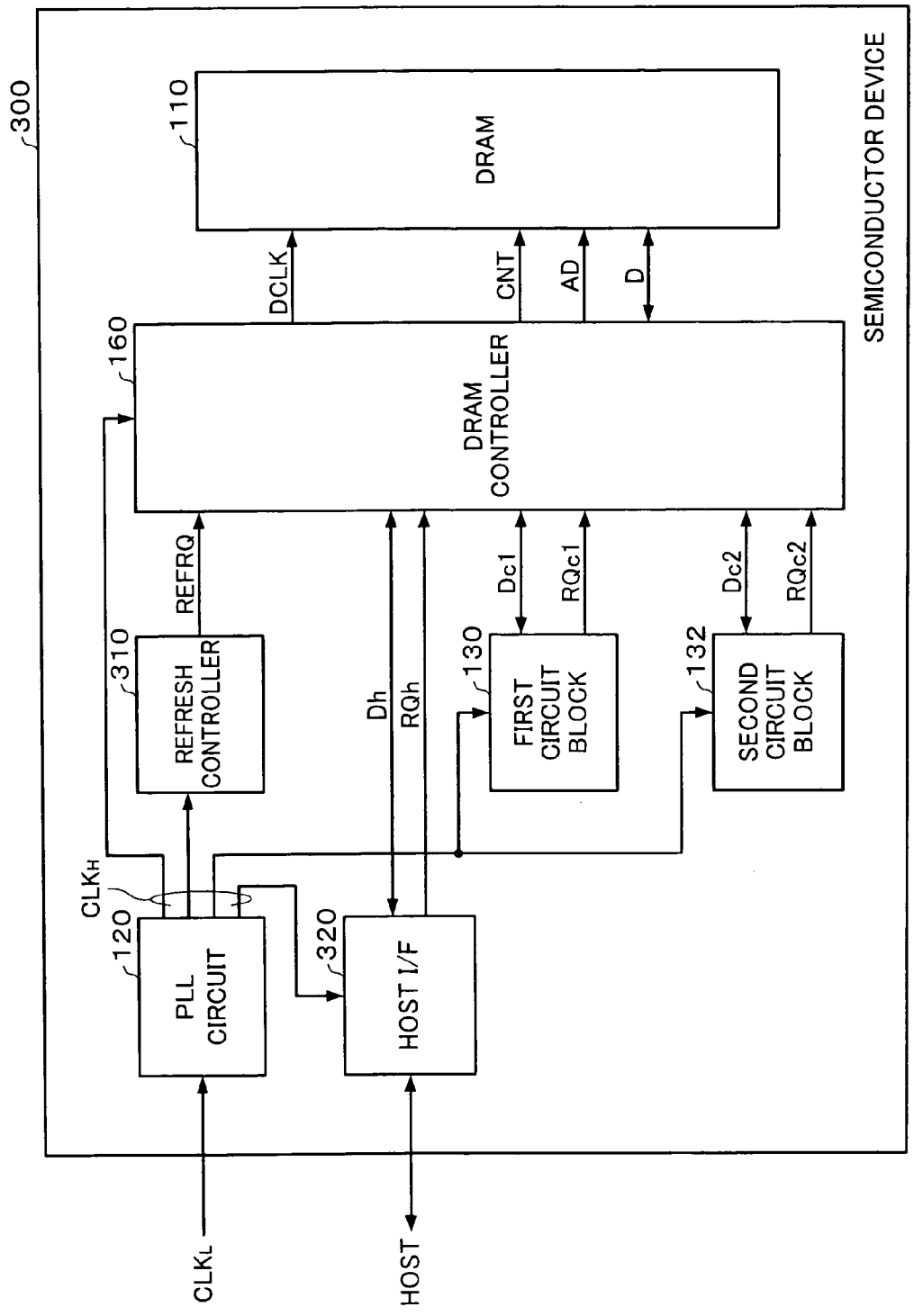
FIG. 3 is a block diagram of a configuration example of a semiconductor device in a comparative example of the first embodiment.

FIG. 3 is a block diagram of a configuration example of a semiconductor device in a comparative example of the first embodiment.

In FIG. 3, sections the same as the sections shown in FIG. 2 are indicated by the same symbols. Description of these sections is appropriately omitted. The first difference between a semiconductor device 300 in the comparative example and the semiconductor device 100 shown in FIG. 2 is that the semiconductor device 100 includes the first and second refresh controllers 140 and 150 and the semiconductor device 300 includes a refresh controller 310. The second difference between the semiconductor device 300 and the semiconductor device 100 is that the semiconductor device 300 does not include the selectors SEL1 and SEL2 so that only the DRAM controller 160 refreshes the DRAM 110. In addition, since the control signal which controls each section differs due to the above-described difference in configuration, the register of the host I/F circuit 320 has a different configuration.

In the semiconductor device 300, the refresh controller 310 must continuously output the refresh request REFRQ to the DRAM controller 160 in the normal mode and the standby mode. The DRAM controller 160 controls refreshing of the DRAM 110 in the normal mode and the standby mode.

Specifically, the PLL circuit 120 outputs the operation clock signal $CLK_H$ even in the standby mode, and the operation clock signal $CLK_H$ is supplied to the refresh controller 310 and the DRAM controller 160. The refresh controller 310 and the DRAM controller 160 operate in synchronization with the operation clock signal $CLK_H$ even in the standby mode.

In the first embodiment, the DRAM 110 can be refreshed in the standby mode while stopping the operations of the PLL circuit 120 and the DRAM controller 160. Specifically, since the supply of the high-frequency operation clock signal $CLK_H$ is suspended so that only the circuits which operate in synchronization with the low-frequency input clock signal $CLK_L$ operate, power consumption can be further reduced.

In the first embodiment, only a minimum number of circuits can be operated in the standby mode by providing the second refresh controller 150 for the standby mode in addition to the first refresh controller 140.

For example, when it is detected that a predetermined refresh period has elapsed by using a counter, the first and second refresh controllers 140 and 150 issue the refresh requests for the DRAM 110. The first refresh controller 140 operates in synchronization with the operation clock signal $CLK_H$, and the second refresh controller 150 operates in synchronization with the input clock signal $CLK_L$. If the refresh period of the DRAM 110 is constant, the first refresh controller 140 requires additional circuits such as counting the refresh period and dividing the operation clock signal in comparison with the second refresh controller 150. Therefore, if the first refresh controller 140 (refresh controller 310 in FIG. 3) operates in synchronization with the input clock signal $CLK_L$, these additional circuits also operate so that additional power is consumed. Since the circuit scale of the first and second refresh controllers 140 and 150 is not significantly large, power consumption can be reduced in the standby mode by providing the second refresh controller 150 separately from the first refresh controller 140.

A configuration example of each section of the semiconductor device 100 according to the first embodiment is described below in detail.

Figure 4:
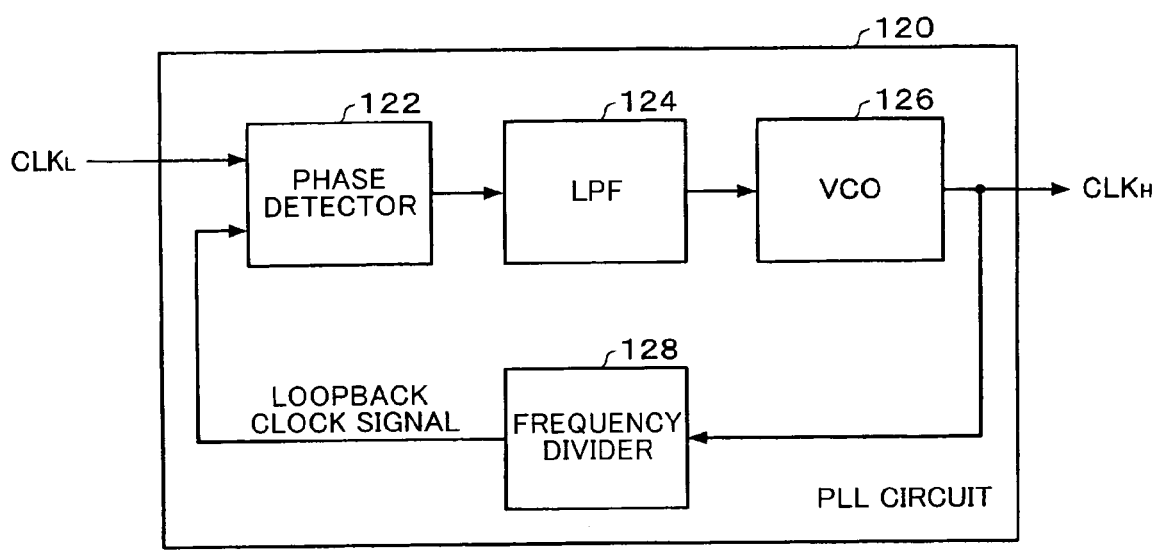
FIG. 4 is a block diagram of a configuration example of a PLL circuit shown in FIG. 2.

FIG. 4 is a block diagram of a configuration example of the PLL circuit 120 shown in FIG. 2.

The PLL circuit 120 includes a phase detector 122, a low-pass filter (LPF) 124, a voltage-controlled oscillator (VCO) 126, and a frequency divider 128.

The phase detector 122 detects the phase difference between the input clock signal $CLK_L$ and a loopback clock signal from the frequency divider 128. Specifically, the phase detector 122 outputs an output signal corresponding to the phase difference between the input clock signal $CLK_L$ and the loopback clock signal. The LPF 124 removes AC components from the output signal from the phase detector 122.

The VCO 126 outputs the operation clock signal $CLK_H$ which changes in frequency corresponding to the output signal from the LPF 124 (voltage corresponding to the phase difference between the input clock signal $CLK_L$ and the loopback clock signal from which the AC components are removed). The operation clock signal $CLK_H$ is also supplied to the frequency divider 128. The frequency divider 128 divides the operation clock signal $CLK_H$ at a predetermined dividing ratio, and outputs the loopback clock signal having a frequency close to the frequency of the input clock signal $CLK_L$.

As a result of the above-described feedback control, the PLL circuit 120 may output the operation clock signal $CLK_H$ at 60 MHz by multiplying the input clock signal $CLK_L$ at 32 kHz, for example.

Figure 5:
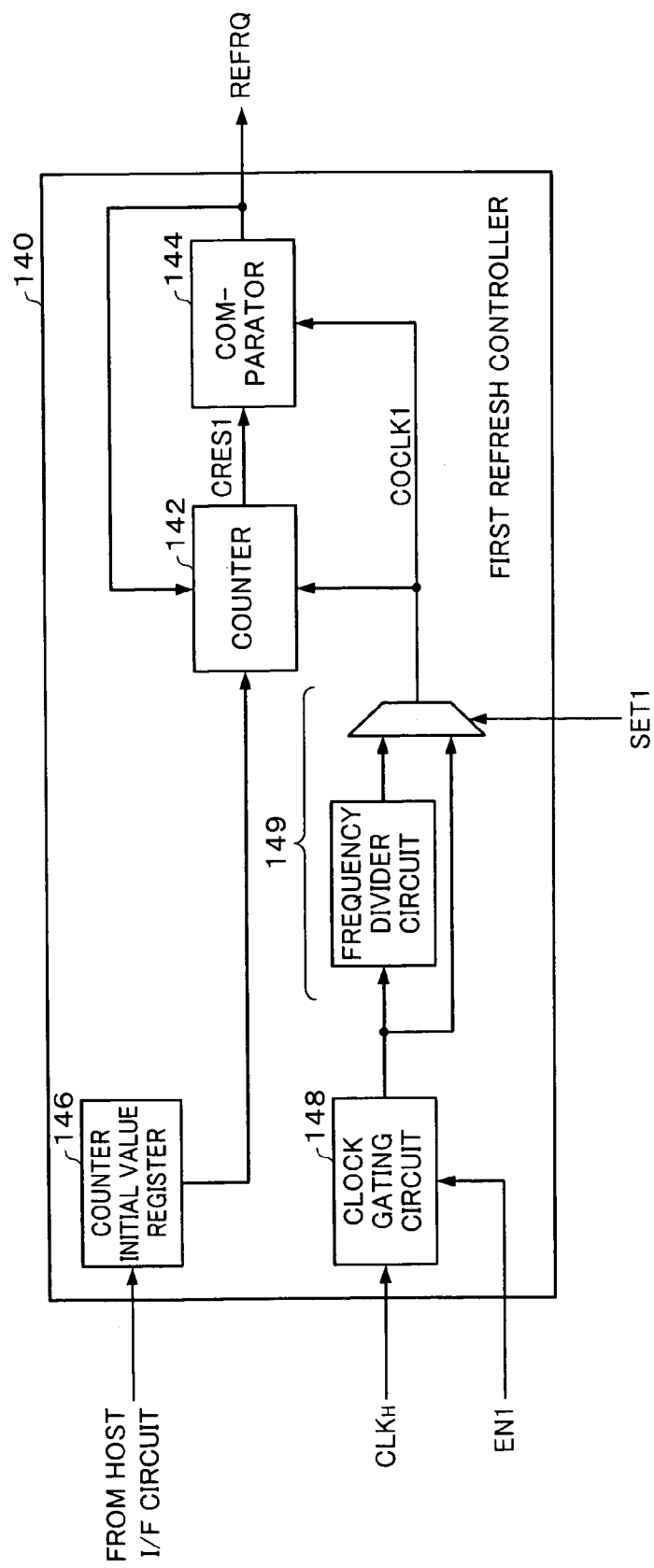
FIG. 5 is a block diagram of a configuration example of a first refresh controller shown in FIG. 2.

FIG. 5 is a block diagram of a configuration example of the first refresh controller 140 shown in FIG. 2.

The first refresh controller 140 generates the refresh request REFRQ for requesting the DRAM controller 160 to perform the refresh operation of the DRAM 110. The first refresh controller 140 includes a counter 142, a comparator 144, and a counter initial value register 146.

The first refresh controller 140 also includes a clock gating circuit 148 and a counter clock signal generation circuit 149. The clock gating circuit 148 performs gating processing of the operation clock signal $CLK_H$ from the PLL circuit 120. In more detail, when an enable signal EN1 which causes the first refresh controller 140 to transition to the activated state is active, the clock gating circuit 148 directly outputs the operation clock signal $CLK_H$. When the enable signal EN1 is not active (inactive), the clock gating circuit 148 fixes its output at the L level, for example.

The output of the clock gating circuit 148 is supplied to the counter clock signal generation circuit 149. The counter clock signal generation circuit 149 generates a counter clock signal COCLK1 which causes the counter 142 and the comparator 144 to operate in synchronization. The counter clock signal generation circuit 149 outputs the output of the clock gating circuit 148 or a frequency-divided clock signal generated by dividing the output of the clock gating circuit 148 as the counter clock signal COCLK1 based on a frequency setting signal SET1 for the counter clock signal of the first refresh controller 140.

The counter 142 counts down the counter initial value set in the counter initial value register 146 in synchronization with the counter clock signal COCLK1. A count result CRES1 of the counter 142 is supplied to the comparator 144. The comparator 144 detects whether or not the count result CRES1 of the counter 142 has become zero. When the comparator 144 detects that the count result CRES1 has become zero, the comparator 144 outputs the refresh request REFRQ set to active.

The refresh request REFRQ is also supplied to the counter 142. When the refresh request REFRQ is set to active, the counter initial value set in the counter initial value register 146 is set in the counter 142.

In FIG. 5, the counter initial value set in the counter initial value register 146 is set through the host I/F circuit 170. The counter initial value register 146 is accessed in synchronization with the operation clock signal $CLK_H$. The enable signal EN1 and the counter clock signal frequency setting signal SET1 are generated based on the value set in the register 180 of the host I/F circuit 170.

Figure 6:
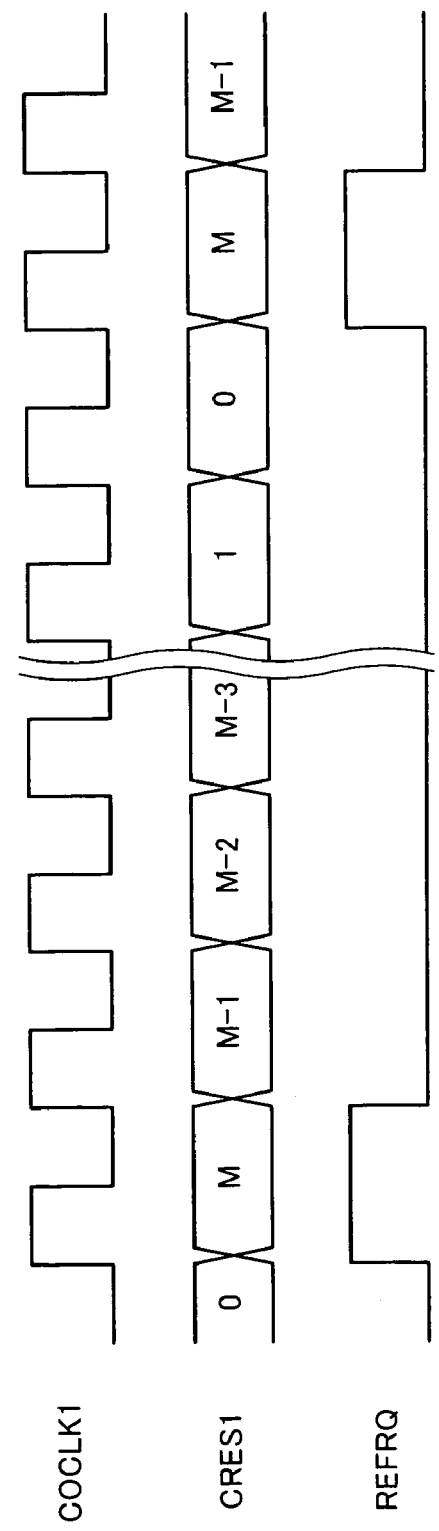
FIG. 6 is a timing diagram of an operation example of the first refresh controller shown in FIG. 5.

FIG. 6 is a timing diagram of an operation example of the first refresh controller 140 shown in FIG. 5.

In FIG. 6, when the refresh request REFRQ has become active, a counter initial value M (M is a natural number) is loaded into the counter 142 as the counter initial value. The counter 142 counts down at a rising edge of the counter clock signal COCLK1. When the count result CRES1 has become zero, the refresh request REFRQ is set to active at the next rising edge of the counter clock signal COCLK1, and the counter initial value M is loaded again into the counter 142 as the counter initial value.

Figure 7:
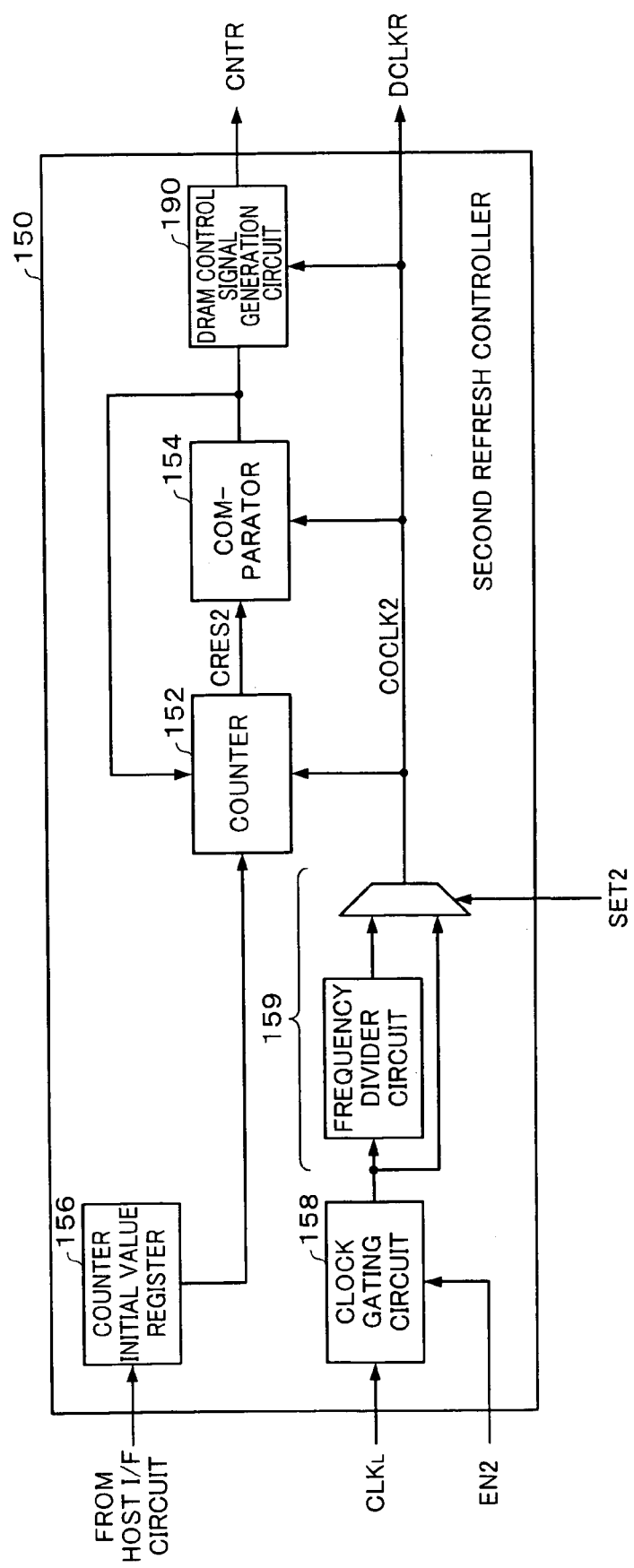
FIG. 7 is a block diagram of a configuration example of a second refresh controller shown in FIG. 2.

FIG. 7 is a block diagram of a configuration example of the second refresh controller 150 shown in FIG. 2. The configuration of the second refresh controller 150 shown in FIG. 7 is almost the same as the configuration of the first refresh controller 140 shown in FIG. 5. Specifically, the second refresh controller 150 includes a counter 152, a comparator 154, a counter initial value register 156, a clock gating circuit 158, and a counter clock signal generation circuit 159. The configuration and the function of each section of the second refresh controller 150 are the same as the configuration and the function of the corresponding section of the first refresh controller 140. Therefore, detailed description is omitted.

The second refresh controller 150 shown in FIG. 7 differs from the first refresh controller 140 shown in FIG. 5 in that the second refresh controller 150 includes a DRAM control signal generation circuit 190 and outputs a counter clock signal COCLK2 generated by the counter clock signal generation circuit 159 as the DRAM clock signal DCLKR. Moreover, the number of bits of the counter 152 and the counter initial value register 156 can be reduced.

When the comparator 154 detects that a count result CRES2 has become zero, the DRAM control signal generation circuit 190 generates an access control signal for performing the refresh operation of the DRAM 110 and outputs the access control signal. This allows the second refresh controller 150 to issue the refresh request to the DRAM 110 to cause the refresh operation to occur, the refresh request bypassing the DRAM controller 160.

In FIG. 7, the counter initial value set in the counter initial value register 156 is set through the host I/F circuit 170 in the same manner as in the first refresh controller 140. The counter initial value register 156 is an asynchronous register. An enable signal EN2 and a counter clock signal frequency setting signal SET2 are generated based on the value set in the register 180 of the host I/F circuit 170 in the same manner as in the first refresh controller 140.

Figure 8:
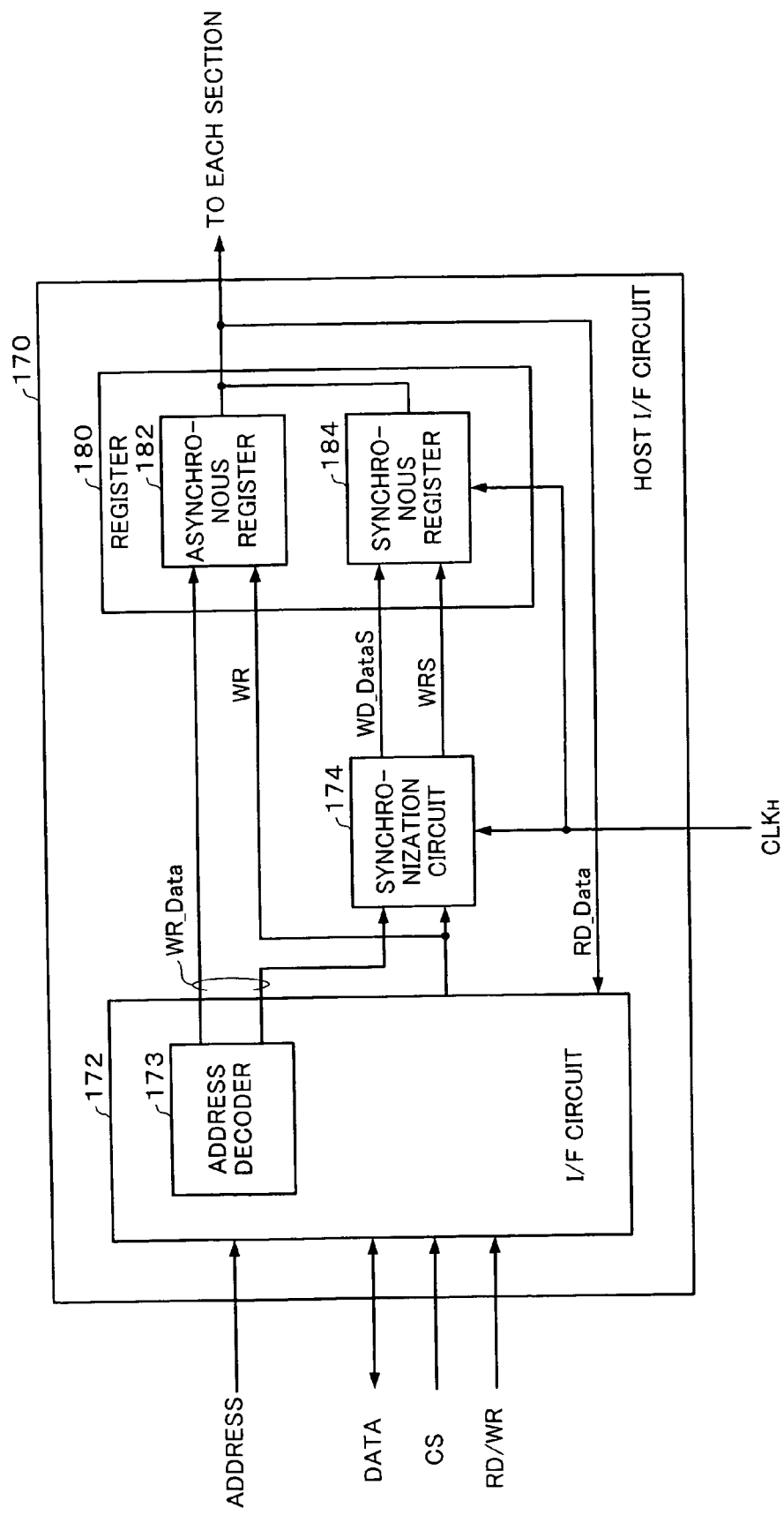
FIG. 8 is a block diagram of a configuration example of a host I/F circuit shown in FIG. 2.

FIG. 8 is a block diagram of a configuration example of the host I/F circuit 170 shown in FIG. 2.

The host I/F circuit 170 includes an I/F circuit 172 and a synchronization circuit 174 in addition to the register 180. The host I/F circuit 170 performs the above-described reception interface processing (processing of receiving data from the host or signal buffering). The host I/F circuit 170 performs the above-described transmission interface processing (processing of transmitting data to the host or signal buffering). The synchronization circuit 174 synchronizes write data WR_Data subjected to the interface processing by the I/F circuit 172 with the operation clock signal $CLK_H$ from the PLL circuit 120.

The register 180 includes an asynchronous register section 182 and a synchronous register section 184. The asynchronous register section 182 includes a register group accessed asynchronously to the operation clock signal $CLK_H$. The synchronous register section 184 includes a register group accessed in synchronization with the operation clock signal $CLK_H$. The access target register is determined by an address decoder 173.

Figure 9:
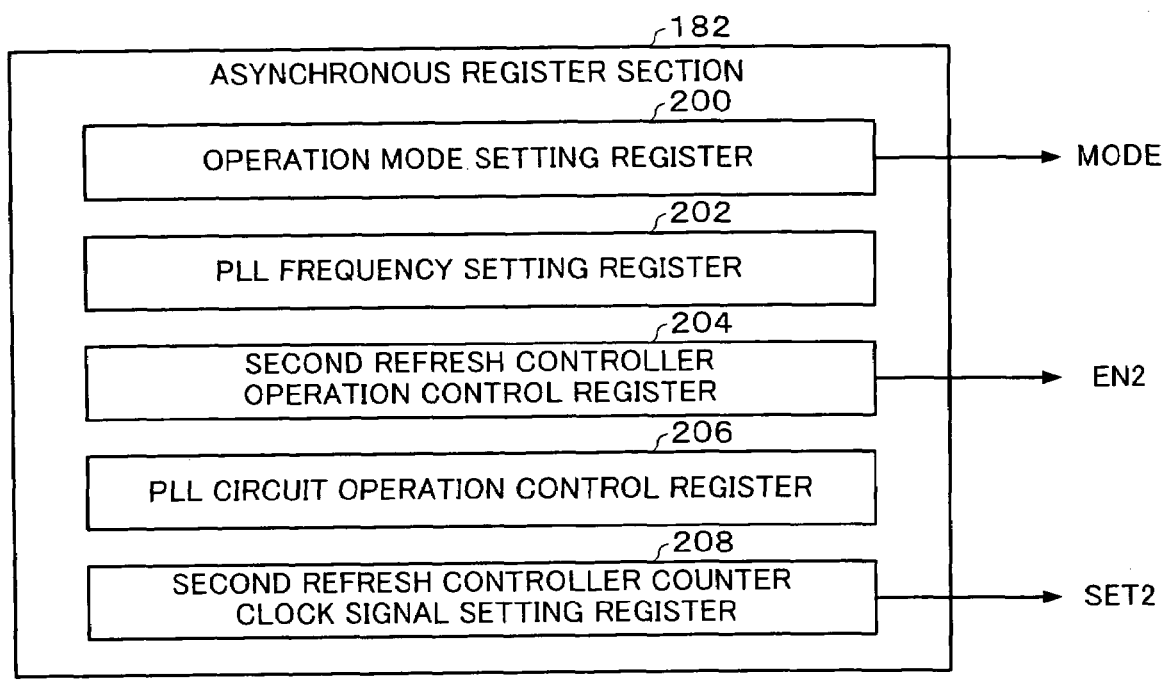
FIG. 9 is a block diagram of a configuration example of an asynchronous register section shown in FIG. 8.

FIG. 9 is a block diagram of a configuration example of the asynchronous register section 182 shown in FIG. 8.

The asynchronous register section 182 may include an operation mode setting register 200, a PLL frequency setting register 202, a second refresh controller operation control register 204, a PLL circuit operation control register 206, and a second refresh controller counter clock signal setting register 208.

A value which indicates the normal mode or the standby mode is set in the operation mode setting register 200. The control signal MODE is generated based on the value set in the operation mode setting register 200.

A value which indicates the frequency of the operation clock signal $CLK_H$ which can be adjusted within the output range of the PLL circuit 120 is set in the PLL frequency setting register 202. The frequency of the operation clock signal $CLK_H$ output by the PLL circuit 120 shown in FIG. 4 is determined by the control signal (not shown) generated based on the value set in the PLL frequency setting register 202.

A value which indicates start or stop of the second refresh controller 150 is set in the second refresh controller operation control register 204. The enable signal EN2 is generated based on the value set in the second refresh controller operation control register 204.

A value which indicates start or stop of the PLL circuit 120 is set in the PLL circuit operation control register 206 (first PLL circuit operation control register). The PLL circuit 120 shown in FIG. 4 starts or stops by the control signal (not shown) generated based on the value set in the PLL circuit operation control register 206.

A value for setting the frequency of the counter clock signal generated by the counter clock signal generation circuit 159 shown in FIG. 7 is set in the second refresh controller counter clock signal setting register 208. The counter clock signal frequency setting signal SET2 is generated based on the value set in the second refresh controller counter clock signal setting register 208.

These registers are accessed from the host asynchronously to the operation clock signal $CLK_H$.

Figure 10:
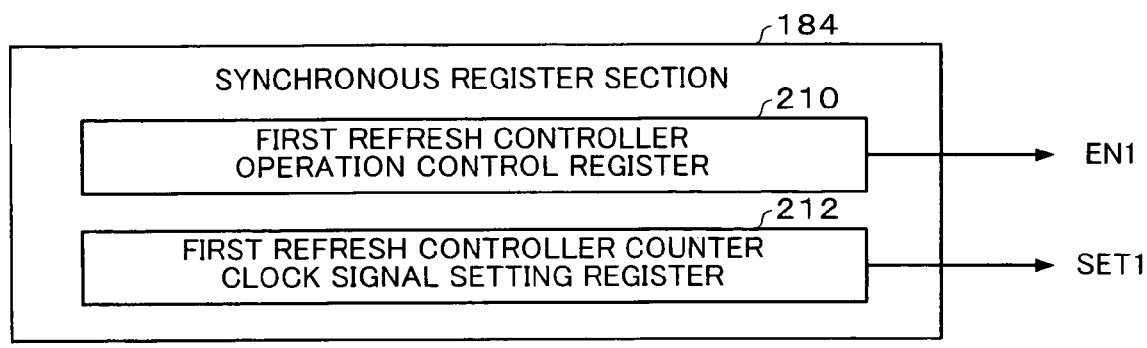
FIG. 10 is a block diagram of a configuration example of a synchronous register section shown in FIG. 8.

FIG. 10 is a block diagram of a configuration example of the synchronous register section 184 shown in FIG. 8.

The synchronous register section 184 may include a first refresh controller operation control register 210 and a first refresh controller counter clock signal setting register 212.

A value which indicates start or stop of the first refresh controller 140 is set in the first refresh controller operation control register 210. The enable signal EN1 is generated based on the value set in the first refresh controller operation control register 210.

A value for setting the frequency of the counter clock signal generated by the counter clock signal generation circuit 149 shown in FIG. 5 is set in the first refresh controller counter clock signal setting register 212. The counter clock signal frequency setting signal SET1 is generated based on the value set in the first refresh controller counter clock signal setting register 212.

The synchronous register section 184 further includes a register for setting the operation of each section which controls the semiconductor device 100. The synchronous register section 184 may include at least one of the counter initial value register 146 shown in FIG. 5 and the counter initial value register 156 shown in FIG. 7.

Figure 11:
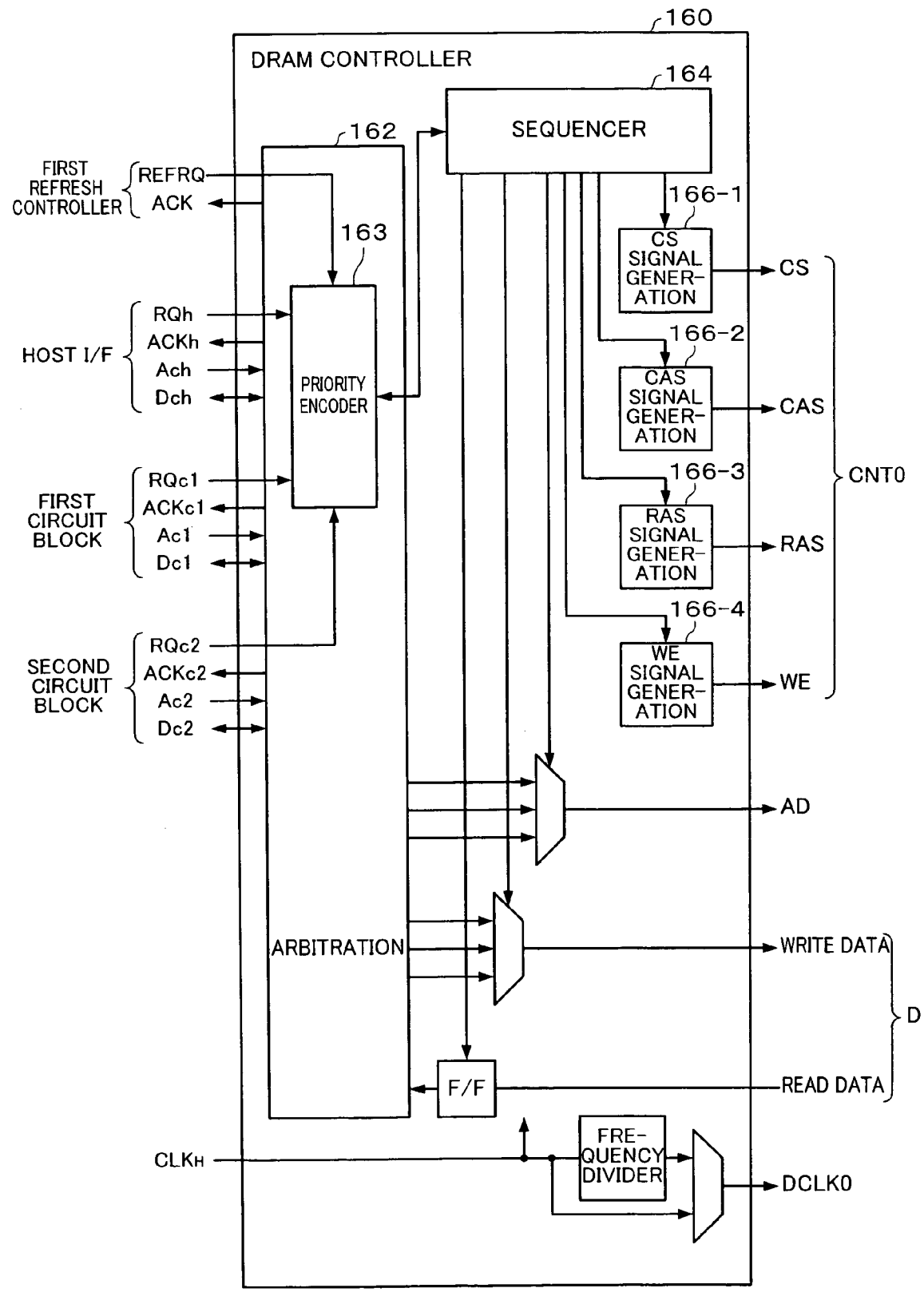
FIG. 11 is a block diagram of a configuration example of a DRAM controller shown in FIG. 2.

FIG. 11 is a block diagram of a configuration example of the DRAM controller 160 shown in FIG. 2.

The DRAM controller 160 arbitrates among the access requests for the DRAM 110 including the refresh request for the DRAM 110, and generates the access control signal corresponding to one of the refresh requests and the access request after arbitration. The DRAM controller 160 includes an arbitration circuit 162, a sequencer 164, a CS signal generation circuit 166-1, a CAS signal generation circuit 166-2, an RAS signal generation circuit 166-3, and a WE signal generation circuit 166-4.

The arbitration circuit 162 includes a priority encoder 163. The priority encoder 163 selects the request with the highest priority from the refresh request REFRQ from the first refresh controller 140, the access request RQh from the host I/F circuit, the access request RQc1 from the first circuit block 130, and the access request RQc2 from the second circuit block 132 according to the priority order determined in advance. The priority encoder 163 notifies the sender of the selected request that the request is selected by using an acknowledge signal (ACK, ACKh, ACKc1, or ACKc2).

The sequencer 164 is also notified of the request selected by the priority encoder 163. The sequencer 164 performs control of executing a series of sequences corresponding to the request selected by arbitration. In more detail, the sequencer 164 performs control of generating the address, write data, and access control signal for accessing the DRAM 110 corresponding to the selected request.

The data read from the DRAM 110 is input to flip-flops (F/F) and output to the sender of the read request through the arbitration circuit 162.

The CS signal generation circuit 166-1 generates the CS signal which is a chip select signal for the DRAM 110. The CAS signal generation circuit 166-2 generates the CAS signal which indicates input timing of the column address of the DRAM 110. The RAS signal generation circuit 166-3 generates the RAS signal which indicates input timing of the row address of the DRAM 110. The WE signal generation circuit 1664 generates the WE signal which indicates whether to perform write control or read control for the DRAM 110.

The DRAM controller 160 operates in synchronization with the operation clock signal $CLK_H$ from the PLL circuit 120. The DRAM controller 160 outputs the operation clock signal $CLK_H$ or a frequency-divided clock signal generated by dividing the operation clock signal $CLK_H$ as the DRAM clock signal DCLK0.

The DRAM clock signal DCLK0 and the access control signal CNT0 (CS signal, CAS signal, RAS signal, and WE signal) output from the DRAM controller 160, or the DRAM clock signal DCLKR and the access control signal CNT0 (CS signal, CAS signal, RAS signal, and WE signal) from the second refresh controller 150 are output to the DRAM 110 as the DRAM clock signal and the access control signal.

Figure 12:
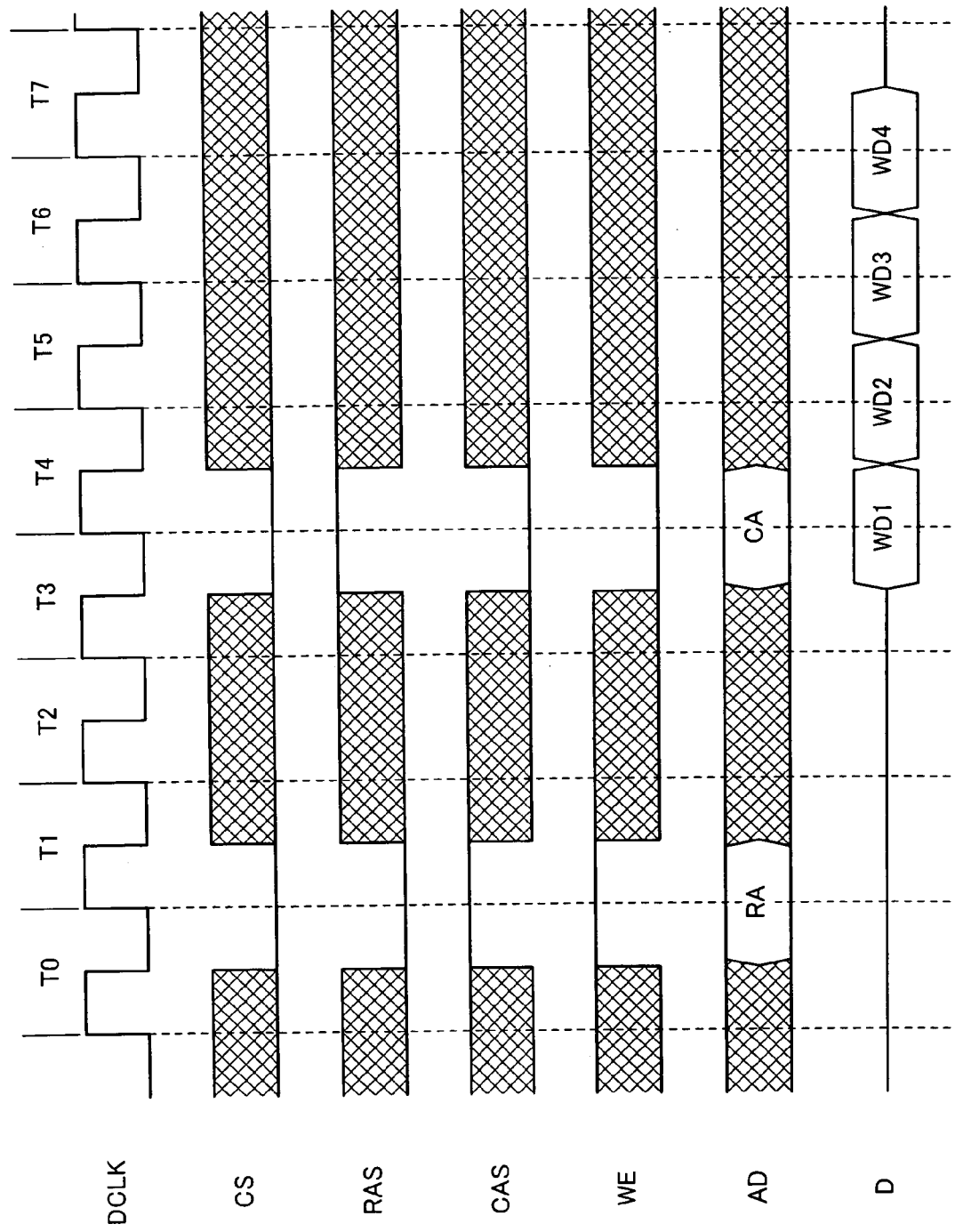
FIG. 12 is a timing example of a DRAM clock signal and an access control signal during write control of a DRAM.

FIG. 12 shows a timing example of the DRAM clock signal and the access control signal during write control of the DRAM 110.

In FIG. 12, the CS signal, the RAS signal, the CAS signal, and the WE signal are active at the L level and inactive at the H level.

For example, when the CS signal and the RAS signal are changed to the L level at the falling edge of the DRAM clock signal DCLK, the address data RA supplied as the row address is input to the DRAM 110.

When the CS signal and the CAS signal are changed to the L level at the falling edge of the DRAM clock signal DCLK, the address data CA supplied as the column address is input to the DRAM 110. The WE signal is also changed to the L level at this timing, so that the write data WD1 is supplied to the DRAM 110. Therefore, the write data WD1 is written into the DRAM 110 in the write region specified by the row address RA and the column address CA.

The write data WD2 is supplied at the next falling edge of the clock signal. Therefore, the column address CA is incremented in the DRAM 110 so that the column address (CA+1) is generated. In the DRAM 110, the write data WD2 is written into the write region specified by the row address RA and the column address (CA+1). Write data WD3 and write data WD4 are sequentially written in the same manner as described above.

Figure 13:
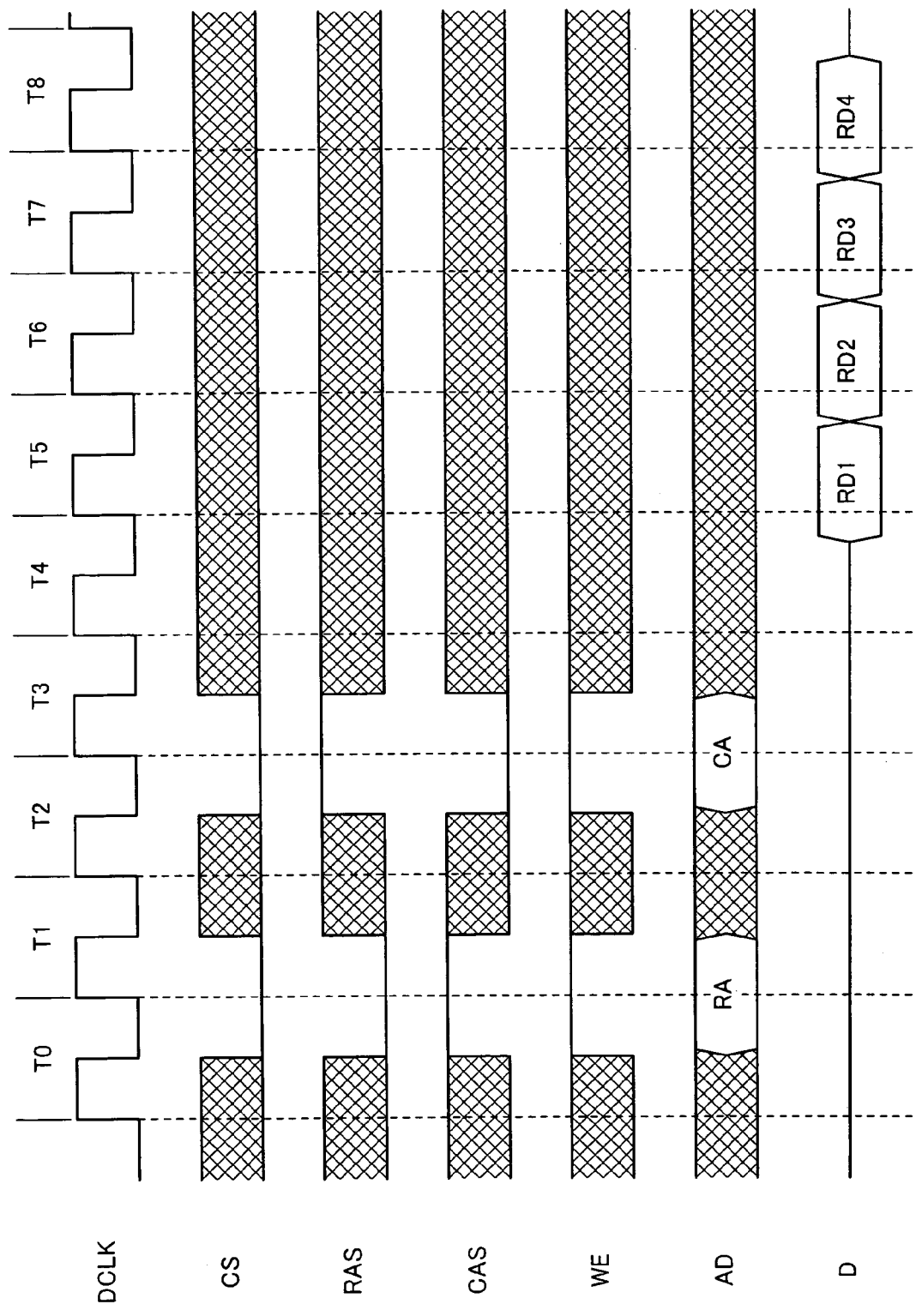
FIG. 13 is a timing example of a DRAM clock signal and an access control signal during read control of a DRAM.

FIG. 13 shows a timing example of the DRAM clock signal and the access control signal during read control of the DRAM 110.

In FIG. 13, the CS signal, the RAS signal, the CAS signal, and the WE signal are active at the L level and inactive at the H level in the same manner as in FIG. 12.

For example, when the CS signal and the RAS signal are changed to the L level at the falling edge of the DRAM clock signal DCLK, the address data RA supplied as the row address is input to the DRAM 110.

When the CS signal and the CAS signal are changed to the L level at the falling edge of the DRAM clock signal DCLK, the address data CA supplied as the column address is input to the DRAM 110. The WE signal remains at the H level at this timing.

Therefore, the DRAM 110 outputs read data RD1 from the read region specified by the row address RA and the column address CA.

The column address CA is incremented in the DRAM 110 at the next falling edge of the clock signal so that the column address (CA+1) is generated, and the DRAM 110 outputs read data RD2 from the read region specified by the row address RA and the column address (CA+1). Read data WD3 and read data WD4 are sequentially output in the same manner as described above.

Figure 14:
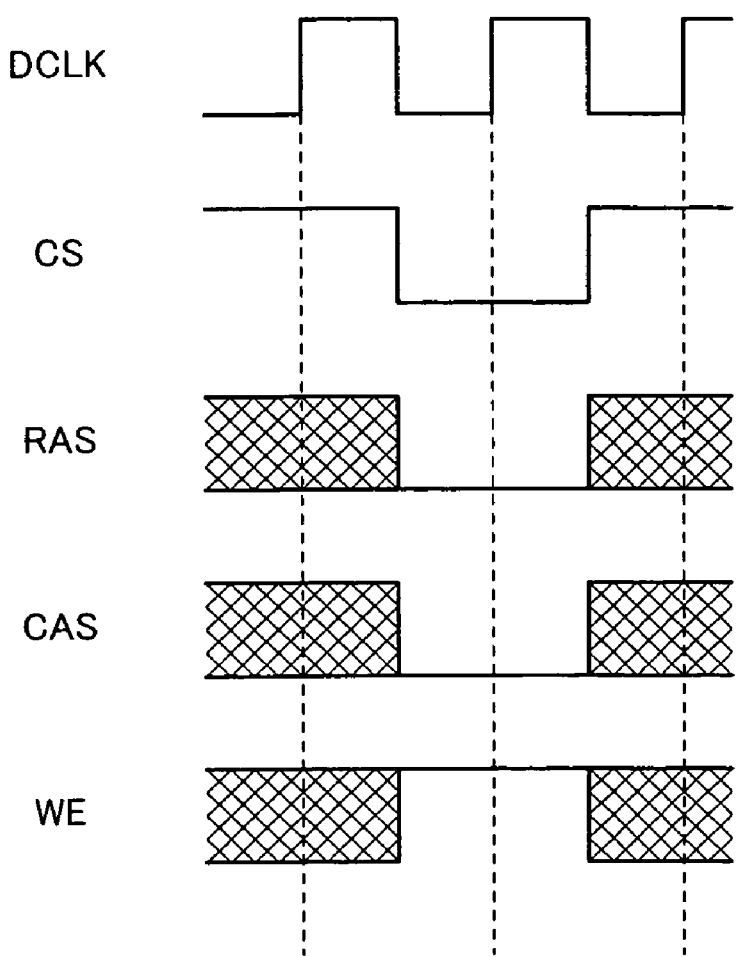
FIG. 14 is a timing example of a DRAM clock signal and an access control signal during refresh control of a DRAM.

FIG. 14 shows a timing example of the DRAM clock signal and the access control signal during refresh control of the DRAM 110.

In FIG. 14, the CS signal, the RAS signal, the CAS signal, and the WE signal are active at the L level and inactive at the H level in the same manner as in FIGS. 12 and 13.

In the first embodiment, the DRAM 110 includes a refresh control section which performs the refresh operation in the DRAM 110. Therefore, when the DRAM controller 160 and the second refresh controller 150 cause the DRAM 110 to start the refresh operation, it suffices to supply the refresh command indicating start of the refresh operation to the DRAM 110. Specifically, it is unnecessary for the DRAM controller 160 and the second refresh controller 150 to supply the refresh address to the DRAM 110. The refresh address is generated by the refresh address counter provided in the DRAM 110.

In the DRAM 110, it is determined that the refresh command is input when the CS signal, the RAS signal, and the CAS signal are changed to the L level at the falling edge of the DRAM clock signal DCLK and the WE signal is set at the H level, as shown in FIG. 14. When start of the refresh operation is indicated by the refresh command, the DRAM 110 performs the refresh operation therein.

Specifically, the DRAM 110 generates the refresh address. The DRAM 110 selects memory cells connected with a wordline (not shown) corresponding to the refresh address, and outputs data retained in each memory cell to a read line (not shown) of the DRAM 110. The data output to the read line is amplified by a sense amplifier and again written into the identical memory cell. Such a configuration and operation of the DRAM 110 are known in the art. Therefore, detailed description is omitted.

In the first embodiment, the DRAM 110 includes the refresh control section. However, the invention is not limited thereto. When the DRAM 110 does not include the refresh control section, the DRAM controller 160 and the second refresh controller 150 may supply the address data, the DRAM clock signal, and the access control signal for performing the above-described refresh operation to the DRAM 110.

A sequence when the semiconductor device 100 having the above-described configuration transitions from the normal mode (first mode) to the standby mode (second mode) is described below.

Figure 15:
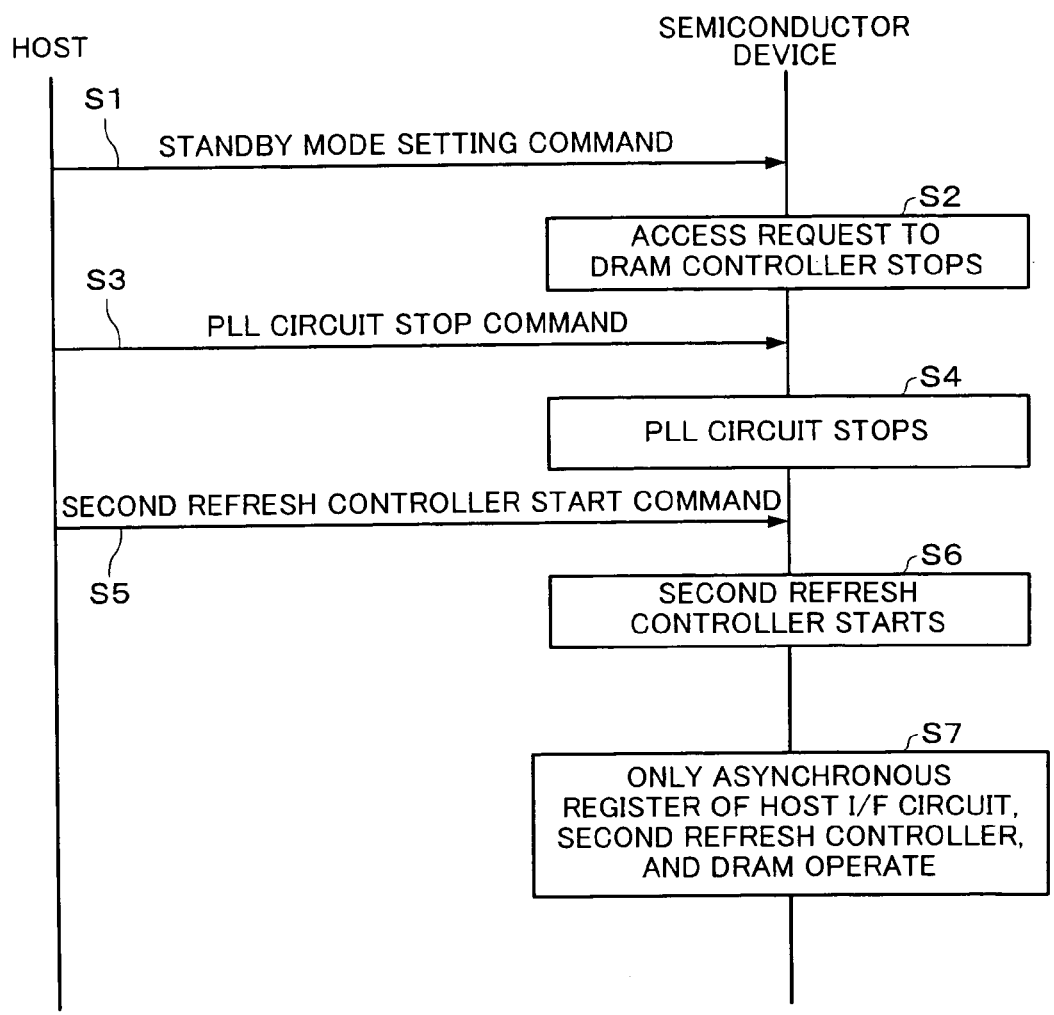
FIG. 15 shows an example of the sequence when a semiconductor device transitions from a normal mode to a standby mode.

FIG. 15 shows a sequence example when the semiconductor device 100 transitions from the normal mode to the standby mode.

In the normal mode, the first refresh controller 140 periodically outputs the refresh request to the DRAM controller 160. In this case, the clock signal is not supplied to the second refresh controller 150 from the clock gating circuit 158 so that the operation of the second refresh controller 150 is suspended.

The host 10 issues a standby mode setting command to the semiconductor device 100 (S1). Specifically, the host 10 sets a value for transitioning to the standby mode in the operation mode setting register 200 of the semiconductor device 100. As a result, the control signal MODE changes so that the access requests from the first and second circuit blocks 130 and 132 and the access request from the host I/F circuit 170 to the DRAM controller 160 are stopped, and the refresh request REFRQ from the first refresh controller 140 is stopped thereafter (S2).

Then, the host 10 issues a PLL circuit stop command to the semiconductor device 100 (S3). Specifically, the host 10 accesses the PLL circuit operation control register 206, and sets a value for stopping the operation of the PLL circuit 120 in the PLL circuit operation control register 206. This causes the operation of the PLL circuit 120 to be stopped so that the operation clock signal $CLK_H$ is fixed at the H level or the L level (S4). Therefore, the operations of the first and second circuit blocks 130 and 132, the first refresh controller 140, the DRAM controller 160, and the synchronous register section 184 of the host I/F circuit 170 are stopped in addition to the PLL circuit 120.

Then, the host 10 issues a second refresh controller start command to the semiconductor device 100 (S5). Specifically, the host 10 accesses the second refresh controller operation control register 204 of the asynchronous register section 182, and directs the start of the second refresh controller 150. This causes the enable signal EN2 to change so that the supply of the clock signal starts through the clock gating circuit 158 of the second refresh controller 150 (S6).

The above-described sequence causes the semiconductor device 100 to transition to the state in which only the asynchronous register section 182 of the register 180 of the host I/F circuit 170, the second refresh controller 150, and the DRAM 110 operate (standby mode) (S7).

A sequence when the semiconductor device 100 transitions from the standby mode (second mode) to the normal mode (first mode) is described below.

Figure 16:
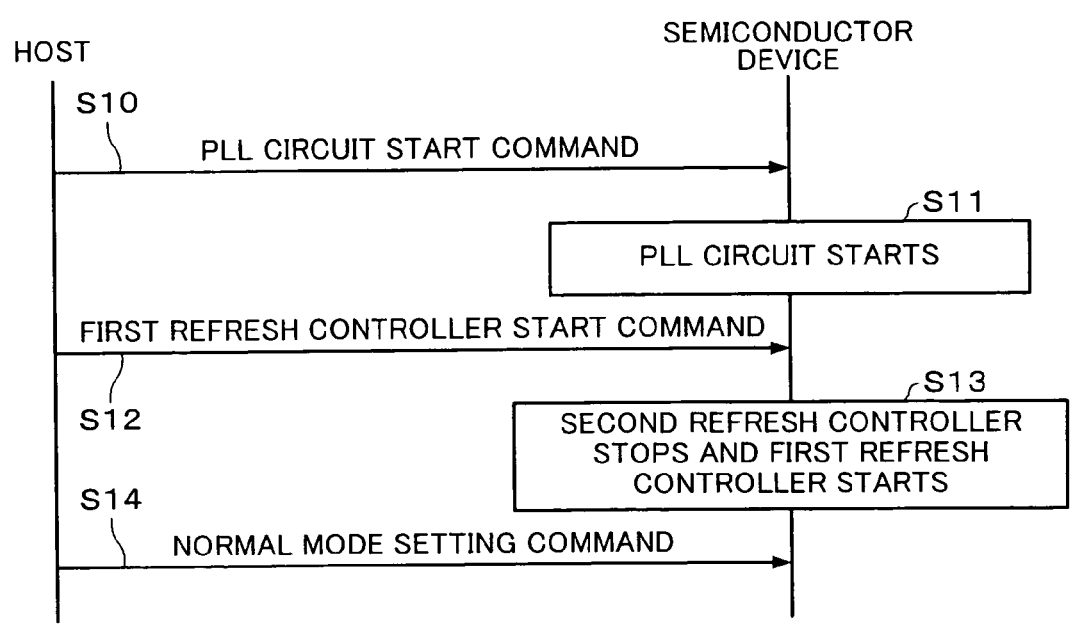
FIG. 16 shows an example of the sequence when a semiconductor device transitions from the standby mode to the normal mode.

FIG. 16 shows a sequence example when the semiconductor device 100 transitions from the standby mode to the normal mode.

In the standby mode, only the asynchronous register section 182 of the register 180 of the host I/F circuit 170, the second refresh controller 150, and the DRAM 110 operate. The second refresh controller 150 periodically outputs the refresh command to the DRAM 110.

The host 10 issues a PLL circuit start command to the semiconductor device 100 (S10). Specifically, the host 10 accesses the PLL circuit operation control register 206, and sets a value for starting the PLL circuit 120 in the PLL circuit operation control register 206. This causes the operation of the PLL circuit 120 to start so that the operation clock signal $CLK_H$ alternately changes to the H level and the L level (S11). Therefore, the first and second circuit blocks 130 and 132, the first refresh controller 140, the DRAM controller 160, and the host I/F circuit 170 start to operate.

Then, the host 10 issues a first refresh controller start command to the semiconductor device 100 (S12). Specifically, the host 10 accesses the first refresh controller operation control register 210 of the synchronous register section 184, and directs the start of the first refresh controller 140. This causes the enable signal EN1 to change so that the supply of the clock signal starts through the clock gating circuit 148 of the first refresh controller 140 (S13). In this case, the host 10 also accesses the second refresh controller operation control register 204 to cause the enable signal EN2 to change so that the supply of the clock signal is stopped through the clock gating circuit 158 of the second refresh controller 150.

The host 10 issues a normal mode setting command to the semiconductor device 100 (S14). Specifically, the host 10 sets a value for transitioning to the normal mode in the operation mode setting register 200 of the semiconductor device 100. This causes the control signal MODE to change so that the access requests from the first and second circuit blocks 130 and 132 and the access request from the host I/F circuit 170 start to be issued to the DRAM controller 160. The stop timing of the second refresh controller 150 may be a timing after the normal mode setting command has been set.

The above-described sequence causes the semiconductor device 100 to transition to the state in which each section excluding the second refresh controller 150 starts to operate in synchronization with the operation clock signal $CLK_H$ (normal mode).

As a modification of the first embodiment, when the storage region of the DRAM 110 is divided into blocks, the refresh operation corresponding to the refresh request from the second refresh controller 150 may be performed for only the block designated by control information for specifying whether or not to refresh each block.

Figure 17:
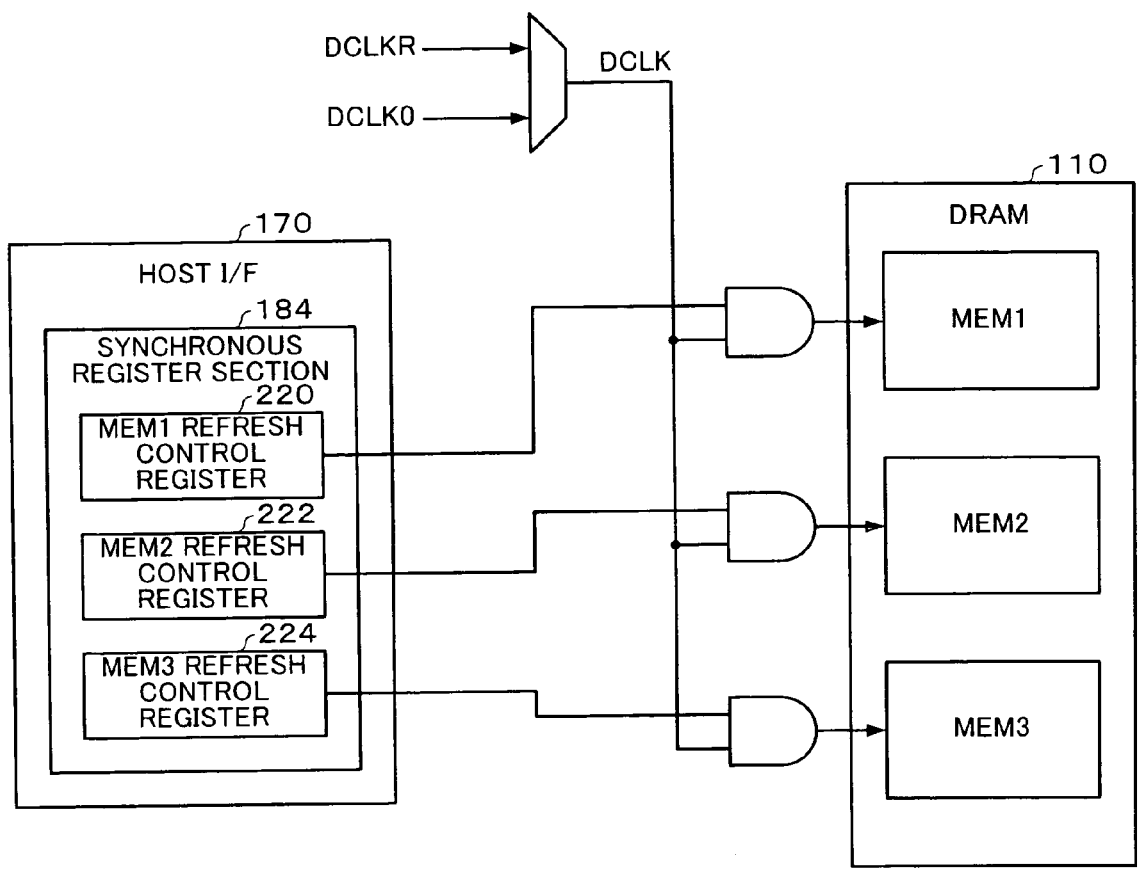
FIG. 17 is a schematic diagram of a configuration example of a semiconductor device according to a modification of the first embodiment.

FIG. 17 schematically shows a configuration example of the major portion of the semiconductor device according to the modification of the first embodiment. In this modification, the storage region of the DRAM 110 is divided into first to third memory blocks. The DRAM clock signal is mask-controlled in memory block units in order to enable or disable the refresh operation based on the refresh request from the DRAM controller 160 or the second refresh controller 150 in memory block units.

In order to perform such control, the synchronous register section 184 of the host I/F circuit 170 may include an MEM1 refresh control register 220, an MEM2 refresh control register 222, and an MEM3 refresh control register 224 in addition to the above-described registers. The host 10 sets control information for enabling or disabling the refresh operation of each memory block in the MEM1 refresh control register 220, the MEM2 refresh control register 222, and the MEM3 refresh control register 224.

The DRAM clock signal DCLK can be mask-controlled based on the control information set in each refresh control register. As a result, a clock signal obtained by mask-controlling the DRAM clock signal DCLK according to the control information set in the MEM1 refresh control register 220 is supplied to a memory block MEM1 of the DRAM 110 as the DRAM clock signal. A clock signal obtained by mask-controlling the DRAM clock signal DCLK according to the control information set in the MEM2 refresh control register 222 is supplied to a memory block MEM2 of the DRAM 110 as the DRAM clock signal. A clock signal obtained by mask-controlling the DRAM clock signal DCLK according to the control information set in the MEM3 refresh control register 224 is supplied to a memory block MEM3 of the DRAM 110 as the DRAM clock signal.

This enables the refresh operation to be omitted in memory block units, whereby power consumption can be further reduced not only in the normal mode but also in the standby mode.

1.2 Second Embodiment

In the first embodiment, the second refresh controller 150 operates in synchronization with the input clock signal $CLK_L$, and outputs the refresh command to the DRAM 110. In a second embodiment, the PLL circuit 120 shown in FIG. 2 is replaced with a first PLL circuit, and a second PLL circuit is additionally provided.

Figure 18:
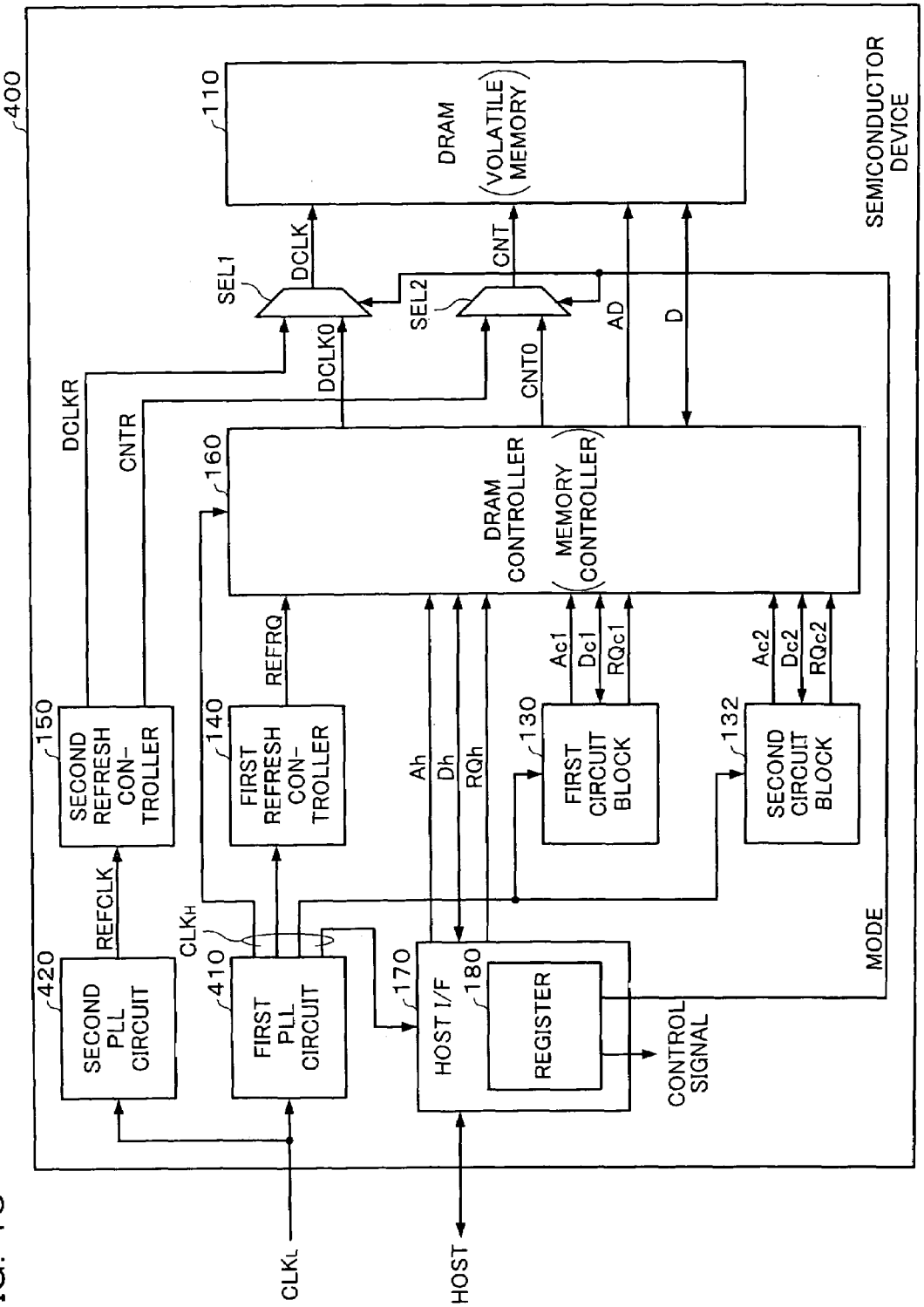
FIG. 18 is a block diagram showing a configuration example of a semiconductor device according to a second embodiment.

FIG. 18 is a block diagram showing a configuration example of a semiconductor device according to the second embodiment. In FIG. 18, sections the same as the sections shown in FIG. 2 are indicated by the same symbols. Description of these sections is appropriately omitted.

A semiconductor device 400 shown in FIG. 18 according to the second embodiment differs from the semiconductor device 100 shown in FIG. 2 according to the first embodiment in that a first PLL circuit 410 is provided instead of the PLL circuit 120 and a second PLL circuit 420 is additionally provided.

The first PLL circuit 410 is the same as the PLL circuit 120 shown in FIG. 2 and has the configuration shown in FIG. 4.

The second PLL circuit 420 also has the configuration shown in FIG. 4. However, the multiplication factor of the second PLL circuit 420 is lower than the multiplication factor of the first PLL circuit 410. Therefore, when the identical input clock signal $CLK_L$ is supplied to the first and second PLL circuits 410 and 420, the frequency of the clock signal output from the second PLL circuit 420 is lower than the frequency of the clock signal output from the first PLL circuit 410. Therefore, power consumption of the second PLL circuit 420 can be reduced in comparison with the first PLL circuit 410.

In FIG. 18, the input clock signal $CLK_L$ is input to the second PLL circuit 420, and the second PLL circuit 420 outputs a refresh clock signal REFCLK generated by multiplying the input clock signal $CLK_L$. The refresh clock signal REFCLK has a frequency higher than the frequency of the input clock signal $CLK_L$ and lower than the frequency of the operation clock signal $CLK_H$. The refresh clock signal REFCLK is supplied to the second refresh controller 150 instead of the input clock signal $CLK_L$ in FIG. 2.

In the second embodiment, the second refresh controller 150 operates in synchronization with the refresh clock signal REFCLK in the standby mode (second mode), and issues the refresh request to the DRAM 110, the refresh request bypassing the DRAM controller 160.

Suppose that the frequency of the input clock signal $CLK_L$ is low and one cycle of the input clock signal $CLK_L$ is T0. Suppose that the refresh period for preventing data retained in the DRAM 110 from being lost is T1. In the configuration according to the first embodiment, when T0 is greater than T1, if the second refresh controller 150 outputs the refresh request in synchronization with the input clock signal $CLK_L$, the refresh request cannot be issued within the refresh period.

In the second embodiment, since the second refresh controller 150 operates in synchronization with the refresh clock signal REFCLK having a frequency higher than the frequency of the input clock signal $CLK_L$, the refresh request can be issued within the refresh period T1.

It is difficult for the first PLL circuit 410 to have an output range sufficient to generate the operation clock signal $CLK_H$ and the refresh clock signal REFCLK by multiplying the input clock signal $CLK_L$. Therefore, power consumption can be reduced by providing the second PLL circuit 420 having a lower multiplication factor separately from the first PLL circuit 410. In this case, it is preferable that the second PLL circuit 420 stops the operation in the normal mode and operates in the standby mode.

A register for controlling the operation of the second PLL circuit 420 may be provided in the register 180 of the host I/F circuit 170 in the same manner as in the first embodiment. In this case, the asynchronous register section 182 may include registers for the second PLL circuit 420 corresponding to the PLL frequency setting register 202 and the PLL circuit operation control register 206 shown in FIG. 9.

1.3 Third Embodiment

In the first embodiment, the second refresh controller 150 is provided in addition to the first refresh controller 140. However, the invention is not limited thereto.

Figure 19:
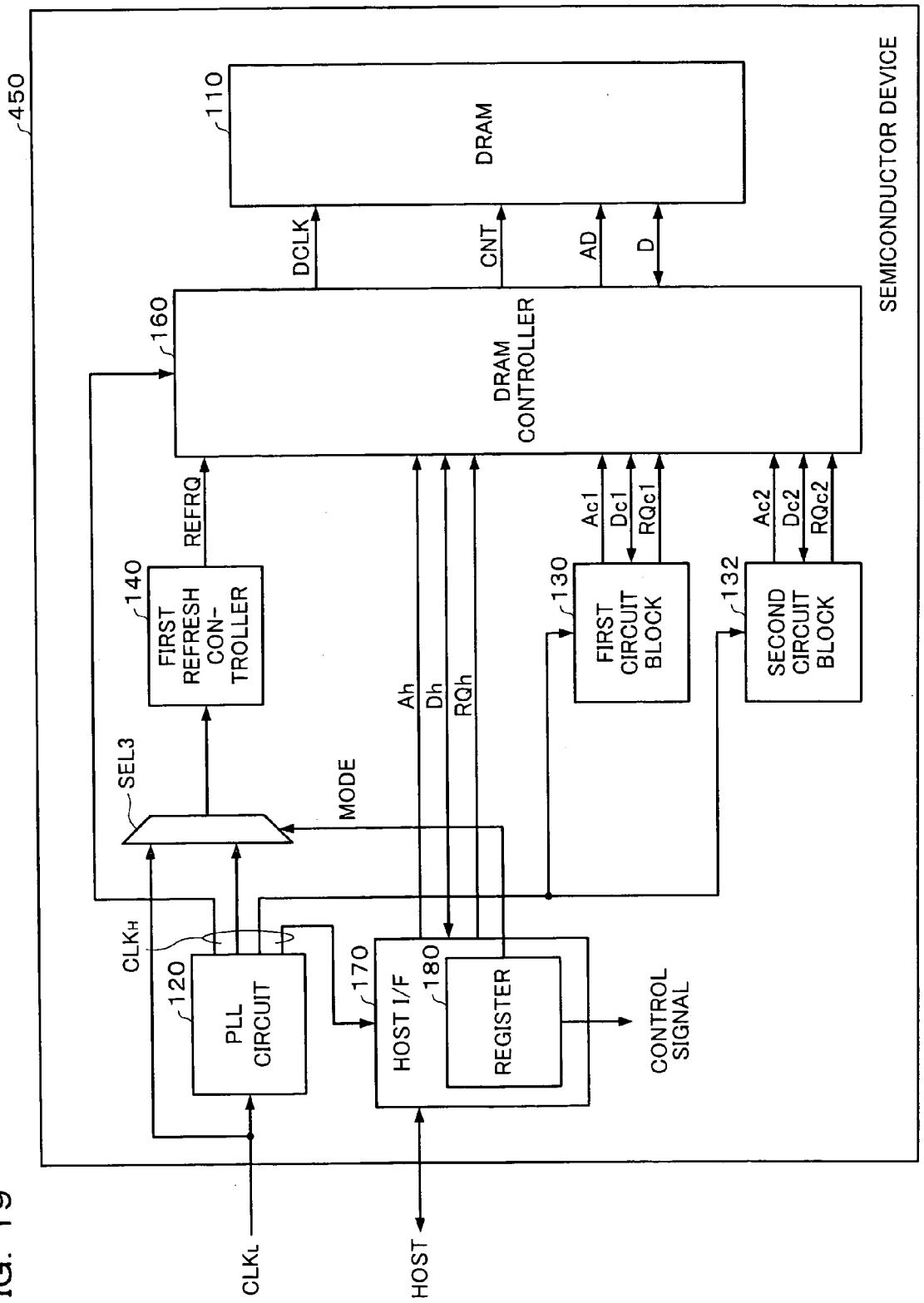
FIG. 19 is a block diagram showing a configuration example of a semiconductor device according to a third embodiment.

FIG. 19 is a block diagram showing a configuration example of a semiconductor device according to a third embodiment. In FIG. 19, sections the same as the sections shown in FIG. 2 are indicated by the same symbols. Description of these sections is appropriately omitted. A semiconductor device 450 shown in FIG. 19 according to the third embodiment differs from the semiconductor device 100 shown in FIG. 2 according to the first embodiment in that the second refresh controller 150 and the selectors SEL1 and SEL2 are omitted and a selector SEL3 is additionally provided.

The selector SEL3 supplies the input clock signal $CLK_L$ or the operation clock signal $CLK_H$ to the first refresh controller 140 (refresh controller) based on the control signal MODE. In more detail, when the normal mode (first mode) is designated by the control signal MODE, the selector SEL3 supplies the operation clock signal $CLK_H$ to the first refresh controller 140. When the standby mode (second mode) is designated by the control signal MODE, the selector SEL3 supplies the input clock signal $CLK_L$ to the first refresh controller 140.

Therefore, in the normal mode in which the PLL circuit 120 operates, the first refresh controller 140 operates in synchronization with the operation clock signal $CLK_H$ and issues the refresh request for the DRAM 110. In the standby mode in which the operation of the PLL circuit 120 stops, the first refresh controller 140 operates in synchronization with the input clock signal $CLK_L$ and issues the refresh request for the DRAM 110.

In the third embodiment, circuit sections of the DRAM controller 160 and the first refresh controller 140 which are not used in both the normal mode and the standby mode may operate in the standby mode. However, since the data retained in the DRAM 110 can be prevented from being lost after stopping the operation of the PLL circuit 120, current consumption of the PLL circuit 120 can be reduced.

1.4 Fourth Embodiment

In the third embodiment, the first refresh controller 140 operates in synchronization with the input clock signal $CLK_L$ in the standby mode, and outputs the refresh command to the DRAM 110. In a fourth embodiment, the PLL circuit 120 shown in FIG. 19 is replaced with a first PLL circuit, and a second PLL circuit is additionally provided.

Figure 20:
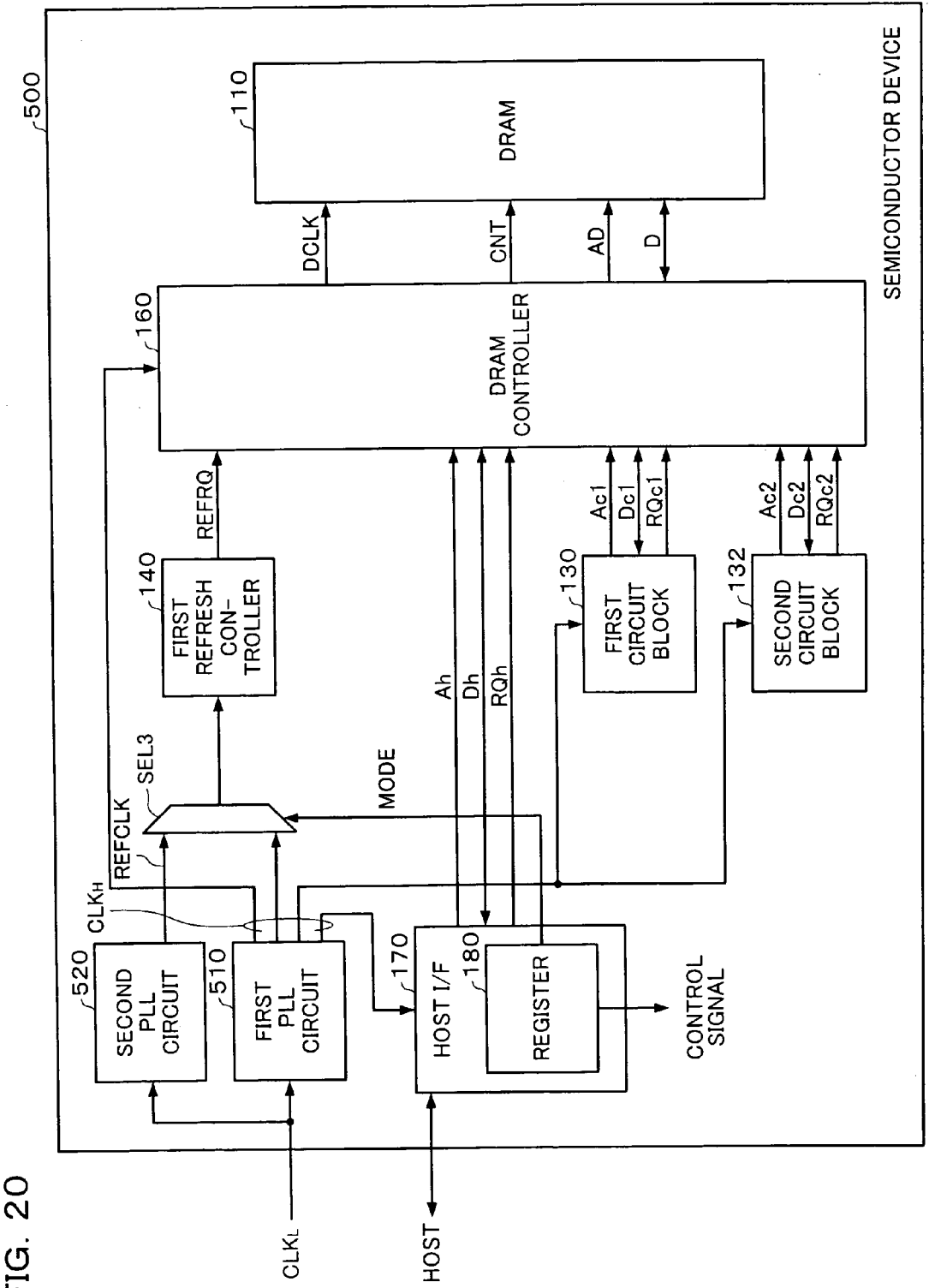
FIG. 20 is a block diagram showing a configuration example of a semiconductor device according to a fourth embodiment.

FIG. 20 is a block diagram showing a configuration example of a semiconductor device according to the fourth embodiment. In FIG. 20, sections the same as the sections shown in FIG. 19 are indicated by the same symbols. Description of these sections is appropriately omitted. A semiconductor device 500 shown in FIG. 20 according to the fourth embodiment differs from the semiconductor device 450 shown in FIG. 19 according to the third embodiment in that a first PLL circuit 510 is provided instead of the PLL circuit 120 and a second PLL circuit 520 is additionally provided.

The first PLL circuit 510 is the same as the PLL circuit 120 shown in FIG. 2 and has the configuration shown in FIG. 4.

The second PLL circuit 520 also has the configuration shown in FIG. 4. However, the multiplication factor of the second PLL circuit 520 is lower than the multiplication factor of the first PLL circuit 510. Therefore, when the identical input clock signal $CLK_L$ is supplied to the first and second PLL circuits 510 and 520, power consumption of the second PLL circuit 520 can be reduced in comparison with the first PLL circuit 510.

In FIG. 20, the input clock signal $CLK_L$ is input to the second PLL circuit 520, and the second PLL circuit 520 outputs the refresh clock signal REFCLK generated by multiplying the input clock signal $CLK_L$. The refresh clock signal REFCLK has a frequency higher than the frequency of the input clock signal $CLK_L$ and lower than the frequency of the operation clock signal $CLK_H$. When the standby mode is designated by the control signal MODE, the refresh clock signal REFCLK is supplied to the first refresh controller 140 through the selector SEL3 instead of the input clock signal $CLK_L$ in FIG. 19.

In the fourth embodiment, the first refresh controller 140 operates in synchronization with the refresh clock signal REFCLK in the standby mode (second mode), and issues the refresh request for the DRAM 110 to the DRAM controller 160.

Suppose that the frequency of the input clock signal $CLK_L$ is low and one cycle of the input clock signal $CLK_L$ is T0. Suppose that the refresh period for preventing data retained in the DRAM 110 from being lost is T1. In the configuration according to the third embodiment, when T0 is greater than T1, if the first refresh controller 140 outputs the refresh request in synchronization with the input clock signal $CLK_L$, the refresh request cannot be issued within the refresh period.

In the fourth embodiment, since the first refresh controller 140 can operate in synchronization with the refresh clock signal REFCLK having a frequency higher than the frequency of the input clock signal $CLK_L$, the refresh request can be issued within the refresh period T1.

It is difficult for the first PLL circuit 510 to have an output range sufficient to generate the operation clock signal $CLK_H$ and the refresh clock signal REFCLK by multiplying the input clock signal $CLK_L$. Therefore, power consumption can be reduced by providing the second PLL circuit 520 having a lower multiplication factor separately from the first PLL circuit 510. In this case, it is preferable that the second PLL circuit 520 stops the operation in the normal mode and operates in the standby mode.

A register for controlling the operation of the second PLL circuit 520 may be provided in the register 180 of the host I/F circuit 170 in the same manner as in the first to third embodiments. In this case, the asynchronous register section 182 may include registers for the second PLL circuit 520 corresponding to the PLL frequency setting register 202 and the PLL circuit operation control register 206 shown in FIG. 9.

In the second to fourth embodiments described above, the refresh operation may be enabled or disabled in memory block units, as shown in FIG. 17.

2. Application to Display Controller

The semiconductor devices according to the first to fourth embodiments may be applied to a display controller which makes up a display system.

Figure 21:
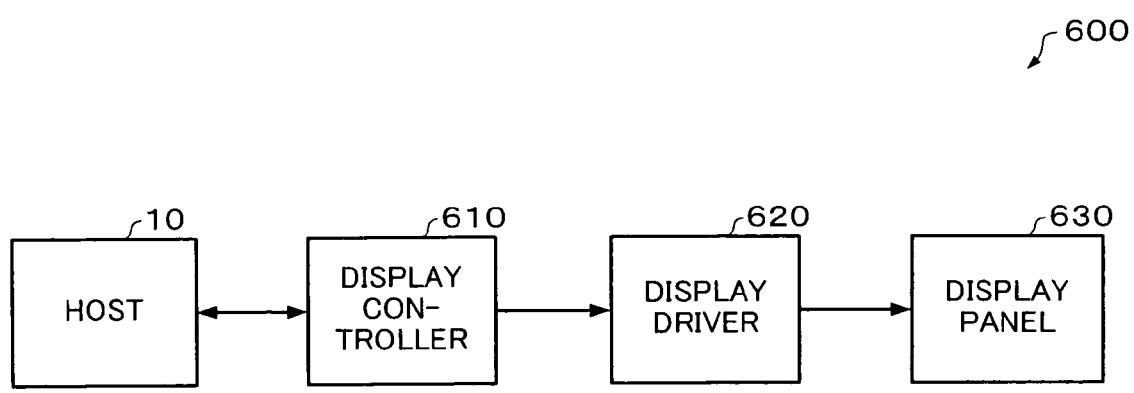
FIG. 21 is a block diagram of a configuration example of a display system.

FIG. 21 is a block diagram of a configuration example of the display system. The display system shown in FIG. 21 is provided in an electronic instrument.

A display system 600 includes the host 10 shown in FIG. 1, a display controller 610, a display driver 620, and a display panel 630. The host 10 includes a central processing unit (CPU) and a memory, and realizes a predetermined function by allowing the CPU to read a program stored in the memory and execute processing corresponding to the program. In this example, the host 10 generates or processes image data corresponding to an image to be displayed in the display panel 630, and supplies the image data to the display controller 610.

The display controller 610 supplies the image data from the host 10 or image data obtained by processing the image data from the host 10 to the display driver 620 which drives the display panel 630. The display controller 610 has the function and the configuration of the semiconductor device according to one of the first to fourth embodiments.

The display driver 620 drives the display panel 630 based on the image data from the display controller 610. As the display panel 630, an active matrix type or simple matrix type LCD panel may be used.

The display controller 610 is provided between the host 10 and the display driver 620 and processes the image data instead of the host 10 so that processing load imposed on the host 10 can be reduced.

Figure 22:
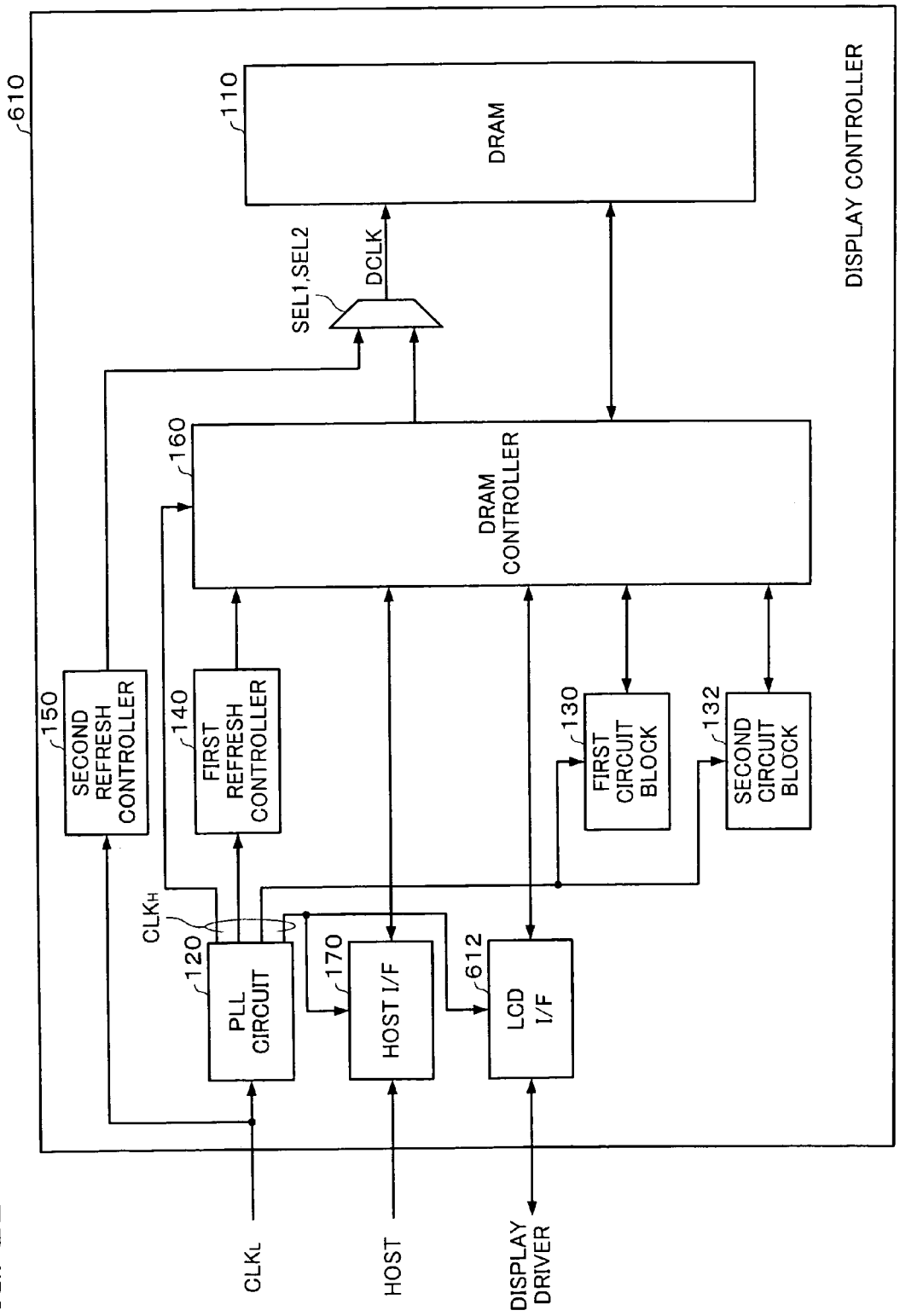
FIG. 22 is a block diagram of a configuration example of a display controller shown in FIG. 21.

FIG. 22 is a block diagram of a configuration example of the display controller 610 shown in FIG. 21.

In FIG. 22, sections the same as the sections shown in FIG. 2 are indicated by the same symbols. Description of these sections is appropriately omitted. In FIG. 22, the configurations of the selectors SEL1 and SEL2 shown in FIG. 2 are simply illustrated.

The display controller 610 shown in FIG. 22 includes an LCD I/F circuit 612 (display driver interface in a broad sense) in addition to the configuration shown in FIG. 2.

The LCD I/F circuit 612 outputs the image data read from the DRAM 110 to the display driver 620. The LCD I/F circuit 612 performs image data interface processing (processing of transmitting image data to the display driver or signal buffering), and outputs the image data after the interface processing to the display driver 620. The LCD I/F circuit 612 includes a synchronization signal generation circuit (not shown). The LCD I/F circuit 612 generates a synchronization signal (e.g. vertical synchronization signal VSYNC, horizontal synchronization signal HSYNC, and dot clock signal DCK) for driving the display panel 630, and supplies the synchronization signal to the display driver 620.

The LCD I/F circuit 612 outputs an access request to the DRAM controller 160 in the same manner as the host I/F circuit 170. The DRAM controller 160 arbitrates among the refresh request from the first refresh controller 140, the access request from the host I/F circuit 170, the access request from the LCD I/F circuit 612, and the access request from the first or second circuit block 130 or 132.

As the first and second circuit blocks 130 and 132, an image rotation processing circuit which rotates the orientation of image data, an image processing circuit which performs compression processing or decompression processing of image data, an image size reduction circuit which reduces the size of image data, or a format conversion processing circuit which performs conversion processing between image data in an RGB format and image data in a YUV format.

In the display controller 610, image data for one frame (or, for at least one scan line) to be displayed in the display panel 630 is retained in the DRAM 110.

FIG. 22 illustrates the case of applying the semiconductor device 100 according to the first embodiment as the display controller 610. However, the semiconductor device according to any of the second to fourth embodiments may also be applied as the display controller 610.

Figure 23:
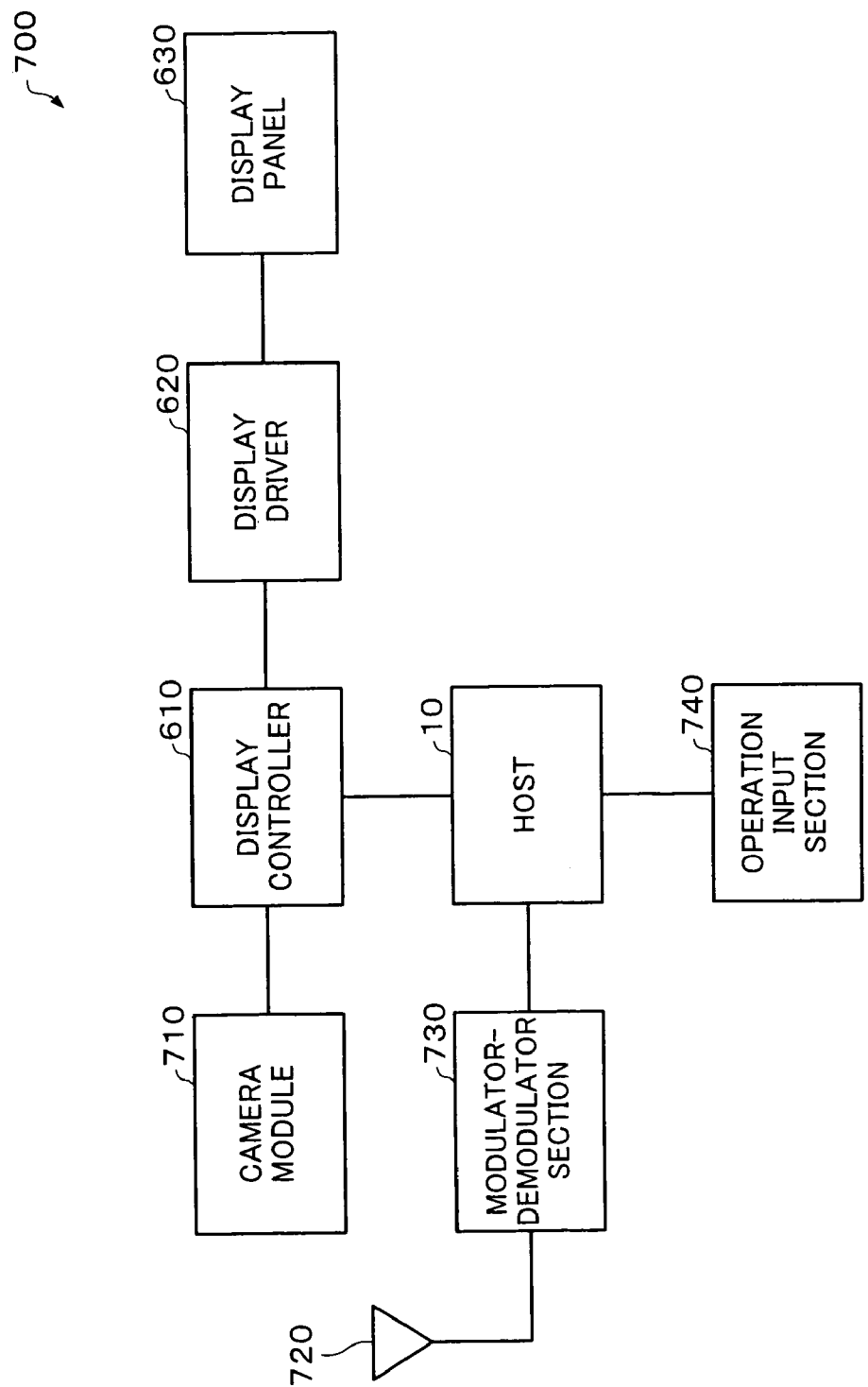
FIG. 23 is a block diagram of a configuration example of an electronic instrument including the display system shown in FIG. 21.

FIG. 23 is a block diagram of a configuration example of an electronic instrument including the display system shown in FIG. 21. FIG. 23 is a block diagram of a configuration example of a portable telephone as an example of the electronic instrument.

In FIG. 23, sections the same as the sections shown in FIG. 21 or 22 are indicated by the same symbols. Description of these sections is appropriately omitted.

A portable telephone 700 includes a camera module 710. The camera module 710 includes a CCD camera, and supplies data of an image captured by using the CCD camera to the display controller 610 in the YUV format.

The portable telephone 700 includes the display panel 630. A liquid crystal display panel may be used as the display panel 630. In this case, the display panel 630 is driven by the display driver 620. The display panel 630 includes a plurality of scan lines, a plurality of data lines, and a plurality of pixels. The display driver 620 has a function of a scan driver which selects the scan lines in units of one or more scan lines, and has a function of a data driver which supplies voltage corresponding to the image data to the data lines.

The display controller 610 is connected with the display driver 620, and supplies the image data to the display driver 620 in the RGB format. The image data may be converted into the RGB format from the YUV format in the display controller 610.

The host 10 is connected with the display controller 610. The host 10 controls the display controller 610. The host 10 demodulates image data received through an antenna 720 by using a modulator-demodulator section 730, and supplies the demodulated image data to the display controller 610. The display controller 610 causes the display driver 620 to display an image in the display panel 630 based on the image data.

The host 10 modulates the image data generated by the camera module 710 by using the modulator-demodulator section 730, and directs transmission of the modulated data to another communication device through the antenna 720.

The host 10 performs image data transmission-reception processing, imaging using the camera module 710, and display processing of the display panel based on operation information from an operation input section 740.

FIG. 23 illustrates the liquid crystal display panel as an example of the display panel 630. However, the invention is not limited thereto. The display panel 630 may be an electroluminescence display device or a plasma display device. The invention may be applied to a display controller which supplies image data to a display driver which drives such a display panel.

The invention is not limited to the above-described embodiments. Various modifications and variations may be made within the spirit and scope of the invention. For example, the invention may be applied not only to the refresh operation of the DRAM, but also to a refresh operation of another memory which requires the refresh operation.

Part of requirements of any claim of the invention could be omitted from a dependent claim which depends on that claim. Moreover, part of requirements of any independent claim of the invention could be made to depend on any other independent claim.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
   a volatile memory which retains data by a cyclic refresh operation;
   a first PLL circuit which multiplies an input clock signal and outputs an operation clock signal having a frequency higher than a frequency of the input clock signal;
   a circuit block which operates in synchronization with the operation clock signal;
   first and second refresh controllers for requesting the refresh operation of the volatile memory; and
   a memory controller which arbitrates between an access request for the volatile memory from the circuit block and a refresh request from the first refresh controller, and controls access to the volatile memory in response to one of the access request and the refresh request,
   wherein, in a first mode in which the first PLL circuit operates, the first refresh controller operates in synchronization with the operation clock signal and issues the refresh request for the volatile memory to the memory controller; and
   wherein, in a second mode in which the first PLL circuit stops operation, supply of the operation clock signal to the first refresh controller and the memory controller is stopped, and the second refresh controller operates in synchronization with the input clock signal and issues the refresh request to the volatile memory, the refresh request bypassing the memory controller.

2. The semiconductor device as defined in claim 1, further comprising:
   a second PLL circuit which has a multiplication factor lower than a multiplication factor of the first PLL circuit, multiplies the input clock signal, and outputs a refresh clock signal having a frequency higher than the frequency of the input clock signal and lower than the frequency of the operation clock signal,
   wherein, in the second mode, the second refresh controller operates in synchronization with the refresh clock signal and issues the refresh request to the volatile memory, the refresh request bypassing the memory controller.

3. The semiconductor device as defined in claim 1, further comprising:
   a register for setting control information which indicates a refresh target block when a storage region of the volatile memory is divided into a plurality of blocks,
   wherein the refresh operation is performed for only the refresh target block of the volatile memory indicated by the control information in response to the refresh request from the second refresh controller.

4. The semiconductor device as defined in claim 1, further comprising:
   a first PLL circuit operation control register which causes the first PLL circuit to start to operate, and is accessed asynchronously to the operation clock signal and the input clock signal,
   wherein the first PLL circuit starts on condition that the first PLL circuit operation control register has been accessed in the second mode.

5. The semiconductor device as defined in claim 1,
   wherein the volatile memory retains image data supplied to a display driver which drives a display panel.

6. An electronic instrument, comprising:
   a display panel;
   a display driver which drives the display panel based on image data; and
   the semiconductor device as defined in claim 5 which supplies data retained in the volatile memory to the display driver as the image data.

7. An electronic instrument, comprising:
   the semiconductor device as defined in claim 1.

8. A semiconductor device, comprising:
   a volatile memory which retains data by a cyclic refresh operation;
   a first PLL circuit which multiplies an input clock signal and outputs an operation clock signal having a frequency higher than a frequency of the input clock signal;
   a circuit block which operates in synchronization with the operation clock signal;
   a refresh controller for requesting the refresh operation of the volatile memory; and
   a memory controller which arbitrates between an access request for the volatile memory from the circuit block and a refresh request from the refresh controller, and controls access to the volatile memory in response to one of the access request and the refresh request,
   wherein, in a first mode in which the first PLL circuit operates, the refresh controller operates in synchronization with the operation clock signal and issues the refresh request for the volatile memory; and
   wherein, in a second mode in which the first PLL circuit stops operation, the refresh controller operates in synchronization with the input clock signal and issues the refresh request for the volatile memory.

9. The semiconductor device as defined in claim 8, further comprising:
   a second PLL circuit which has a multiplication factor lower than a multiplication factor of the first PLL circuit, multiplies the input clock signal, and outputs a refresh clock signal having a frequency higher than the frequency of the input clock signal and lower than the frequency of the operation clock signal,
   wherein, in the second mode, the refresh controller operates in synchronization with the refresh clock signal and issues the refresh request to the volatile memory, the refresh request bypassing the memory controller.

10. The semiconductor device as defined in claim 8, further comprising:

a register for setting control information which indicates a refresh target block when a storage region of the volatile memory is divided into a plurality of blocks, wherein the refresh operation is performed for only the refresh target block of the volatile memory indicated by the control information in response to the refresh request from the memory controller.

11. The semiconductor device as defined in claim 8, further comprising:

a first PLL circuit operation control register which causes the first PLL circuit to start to operate, and is accessed asynchronously to the operation clock signal and the input clock signal, wherein the first PLL circuit starts on condition that the first PLL circuit operation control register has been accessed in the second mode.

12. The semiconductor device as defined in claim 8, wherein the volatile memory retains image data supplied to a display driver which drives a display panel.

13. An electronic instrument, comprising:

a display panel;

a display driver which drives the display panel based on image data; and the semiconductor device as defined in claim 12 which supplies data retained in the volatile memory to the display driver as the image data.

14. An electronic instrument, comprising:

the semiconductor device as defined in claim 8.

* * * * *